United States Patent
Watanabe et al.

(10) Patent No.: US 6,462,411 B1
(45) Date of Patent: Oct. 8, 2002

(54) SEMICONDUCTOR WAFER PROCESSING APPARATUS FOR TRANSFERRING A WAFER MOUNT

(75) Inventors: Tomoji Watanabe; Nobuyuki Mise, both of Tsuchiura; Toshiyuki Uchino, Kodaira; Norio Suzuki, Kodaira; Yoshihiko Sakurai, Kodaira; Toshiya Uenishi, Kodaira; Yohsuke Inoue, Hitachi; Yasuhiro Inokuchi; Fumihide Ikeda, both of Tokyo, all of (JP)

(73) Assignee: Kokusai Electric Co., LTD, Tokyo (JP)

( * ) Notice: Subject to any disclaimer, the term of this patent is extended or adjusted under 35 U.S.C. 154(b) by 0 days.

(21) Appl. No.: 09/205,299

(22) Filed: Dec. 4, 1998

(30) Foreign Application Priority Data

Dec. 5, 1997 (JP) .............................. 9-335825

(51) Int. Cl.[7] .............................................. H01L 23/34
(52) U.S. Cl. ................. 257/723; 29/25.01; 414/225.01; 118/500; 118/725
(58) Field of Search ......................... 29/25.01; 414/935, 414/937, 940, 941, 222.01, 225.01, 936, 938; 118/728, 729, 725, 726, 500; 392/416, 418; 438/663, 715, 913, FOR 408; 294/1.1, 32, 64, 1; 257/723

(56) References Cited

U.S. PATENT DOCUMENTS

| | | | | |
|---|---|---|---|---|
| 5,042,423 A | * | 8/1991 | Wilkinson | 118/500 |
| 5,046,909 A | * | 9/1991 | Murdoch | 294/113 |
| 5,169,684 A | * | 12/1992 | Takagi | 118/728 |
| 5,404,894 A | * | 4/1995 | Shiraiwa | 414/941 |
| 5,474,612 A | | 12/1995 | Sato et al. | 118/728 |
| 5,485,486 A | * | 1/1996 | Blackburn et al. | 118/728 |
| 5,527,393 A | | 6/1996 | Sato et al. | 118/728 |
| 5,872,889 A | * | 2/1999 | Kaltenbrunner et al. | 392/418 |
| 5,960,159 A | * | 9/1999 | Ikeda et al. | 392/418 |
| 5,990,585 A | * | 11/1999 | Lowrance | 310/67 |
| 6,068,441 A | * | 5/2000 | Raaijmakers et al. | 414/609 |
| 6,155,773 A | * | 12/2000 | Ebbing et al. | 414/744.5 |
| 6,158,941 A | * | 12/2000 | Muka et al. | 414/222.12 |
| 6,332,927 B1 | * | 12/2001 | Inokuchi et al. | 118/725 |
| 6,217,663 B1 | * | 4/2002 | Inokuchi et al. | 118/728 |

FOREIGN PATENT DOCUMENTS

| | | | | |
|---|---|---|---|---|
| JP | 2 69932 | | 3/1990 | 118/729 |
| JP | 5-55342 | * | 3/1993 | |
| JP | 5-206251 | * | 8/1993 | |
| JP | 6 163444 | | 6/1994 | 118/729 |
| JP | 7 94419 | | 4/1995 | 118/728 |

* cited by examiner

Primary Examiner—David L. Talbott
Assistant Examiner—Alonzo Chambliss

(57) ABSTRACT

A semiconductor wafer processing apparatus comprises a reaction furnace capable of heating inside thereof, a wafer mount for mounting a semiconductor wafer thereon and a transfer device. The wafermount includes an opening which is greater than the semiconductor wafer and which has a circle shape or a shape substantially similar to an outer periphery of the semiconductor wafer, and includes a wafer supporting portion projecting inwardly of the opening for supporting the semiconductor wafer. The transfer device is capable of holding the wafer mount outside the semiconductor wafer as viewed from a vertical direction, and transferring the wafer mount carrying the semiconductor wafer thereon substantially horizontally into and/or out from the reaction furnace.

28 Claims, 18 Drawing Sheets

SEMICONDUCTOR WAFER PROCESSING APPARATUS FOR TRANSFERRING A WAFER MOUNT

BACKGROUND OF THE INVENTION

1. Field of the Invention

The present invention relates to a semiconductor wafer processing apparatus, and more particularly, to a diffusion apparatus for oxidizing or annealing a wafer used in a semiconductor device manufacturing process, and a semiconductor wafer processing apparatus utilizing a thermal CVD (Chemical Vapor Deposition) for forming, on a wafer surface, a metal film, a metal silicide film, an oxide film, a nitride film, a poly-crystalline silicon film, a dielectric film or an epitaxial silicon film or the like, and the present invention especially relates to a hot wall type single wafer or couple of wafers substrate processing type oxidizing apparatus and a single wafer or couple of wafers processing type CVD method which do not generate slip lines due to thermal stress.

2. Description of the Related Art

At present, a batch type apparatus (a vertical-type diffusion apparatus, a vertical-type CVD apparatus) is mainly used for a semiconductor thermal treatment process such as oxidization, anneal and thermal CVD. However, in order to cope with a high integration tendency of a semiconductor device, a technique for forming a very thin oxide film of about a couple of nanometers or a shallow diffusion layer, and a technique for preventing a natural oxidation are indispensable.

To meet these requirements, a single wafer or small number of wafers processing apparatus suitable for short time processing shorter than a couple of minutes is advantageous. Further, there is a merit that this single wafer or small number of wafers processing apparatus can easily cope with clustering unit or a larger diameter tendency of a wafer. On the other hand, it has been found that there is a problem in a manufacturing line in which a batch type apparatus and a single wafer or small number of wafers processing apparatus (an etching apparatus, a sputtering apparatus and so forth) are mixed in view of the fact that a semiconductor device cannot be manufactured within a short time. Therefore, a single wafer or small number of wafers processing thermal treatment apparatus becomes indispensable.

In the above described single wafer or small number of wafers processing thermal treatment apparatus, rapid heating is indispensable for improving a throughput. In that case, however, there is a problem that slip lines are generated due to thermal stress by temperature deviation within a wafer face. To cope with this problem, various methods have been studied and proposed to reduce slip lines with lamp annealing apparatus which heals a wafer at 1,000° C. or higher within tens of seconds mainly using halogen lamp or ark lamp. Examples of such methods are shown below.

Japanese Patent Application Laid-open No.6-163444 (Conventional Art 1) discloses a technique to dispose a wafer such that an orientation flat of the wafer opposes to an opening of a guard ring, and heat the wafer using a lamp, and a technique to provide an auxiliary ring connected to opposite ends of the guard ring such as to bypass the opening of the guard ring. The wafer and the guard ring are held substantially flush with each other by a pin holder.

The above conventionally known art is for suppressing or preventing slip lines from being generated on a wafer in a lamp annealing apparatus. The lamp annealing apparatus to which this conventional art is applied has a merit that the wafer can be heated within a short time. On the other hand, as compared with the batch type thermal treatment apparatus, there are problems that uniformity of temperature of wafers is inferior, consumption of electricity is greater, and a lifetime of the lamp is short.

Japanese Patent Application Laid-open No.2-69932 (Conventional Art 2) disclosed by the present inventors discloses a semiconductor wafer thermal treatment apparatus as a single wafer or small number of wafers processing thermal treatment apparatus in which the above problems are overcome. This is a vertical-type single wafer or small number of wafers processing thermal treatment apparatus, in which a plurality of wafers are substantially vertically held on a transfer jig having function for both supporting and transferring the wafers, the wafers are inserted at a high speed into a reaction furnace provided at its lower portion with an insertion opening and a retrieving opening, and the wafers are oxidized or annealed. In the above mentioned former lamp anneal apparatus, after the wafer is inserted into a reaction furnace, the lamp is electrically conducted to start heating the wafer. Whereas, in the latter conventional apparatus, the heater is always electrically conducted to keep the reaction chamber at a high temperature (hot wall type), and the wafers are inserted at a high speed and processed. Therefore, there are merits that uniformity of temperature of wafers is excellent, consumption of electricity is small, and lifetime of the heater is long. However, as in the lamp anneal apparatus, the hot wall type single wafer or small number of wafers processing thermal treatment apparatus also has a problem that slip lines are generated due to thermal stress by temperature deviation within the wafer face. That is, since the latter conventional apparatus simultaneously processes the two wafers, the center of each of the wafers is heated only from its one side facing the heater but the edge of each of the wafers is also heated by radiation entering from clearances among wafers and therefore, temperature of the outer side of the wafer rises faster than the inner side of the wafer. In the latter conventional application, there is disclosed a technique to relatively retard the temperature rise of the wafer edge by providing rings among or outside the two wafers supported on the transfer jig.

As a CVD apparatus which keeps the merit of the above mentioned vertical-type single wafer or small number of wafers processing thermal treatment apparatus, and which makes it easy to use the apparatus as a cluster unit, there is a known single wafer or small number of wafers processing CVD apparatus for horizontally-holding a plurality of wafers for processing. This single wafer or small number of wafers processing CVD apparatus is disclosed in Japanese Patent Application Laid-open No.7-94419 (Conventional Art 3). A structure of a reaction furnace of this single wafer or small number of wafers processing CVD apparatus will be explained with reference to FIGS. 15 to 17b. FIG. 15 is a cross-sectional view of the reaction furnace of the conventional single wafer or small number of wafers processing CVD apparatus as viewed from above. FIG. 16 is a vertical cross-sectional view of the reaction furnace of the conventional single wafer or small number of wafers processing CVD apparatus as viewed side. FIGS. 17a and 17b are vertical cross-sectional views of the reaction furnace of the conventional single wafer or small number of wafers processing CVD apparatus as viewed from side for showing a supporting method of wafers in the reaction furnace. The apparatus is provided at its upper and lower portions with flat heaters 1 each divided into a plurality of zones, and a reaction tube 2 is disposed between the upper and lower heaters 1. Two wafers 3 in a horizontal state are inserted and heated. While a gas is supplied from a gas supply port 4 (4a, 4b), the gas is discharged from an exhaust port 5 (5a, 5b) disposed opposite side from the gas supply port 4 (4a, 4b) (gas flows in parallel to the wafers 3 as shown by white or black arrow in the drawings), thereby forming films on the wafers 3. A base 20 is disposed in the reaction tube 2, and supporting plates 8a and 8b for supporting the wafers 3 thereon are provided on the base 20. The supporting plates 8a and 8b are positioned at substantially central portion of the reaction tube 2. Supporting plate holding pins 22 are provided on the base 20 at four corners of the supporting plates 8a and 8b. Each of the supporting plate holding pins 22 is formed such that its thickness is changed in two steps, i.e., the lowermost portion thereof is the thickest and the uppermost portion thereof is the thinnest. The lower supporting plate 8b is abutted and stopped against the lower step of the supporting plate holding pins, and the upper supporting plate 8a is abutted and stopped against the upper step. The supporting plates 8a and 8b are provided at their central portions with openings 84 having substantially the same shape and same size as those of the wafer 3, and the wafers 3 are held on supporting pins 82a and 82b provided around the openings 84. Two wafers 3 are placed on the transfer jigs 11 and simultaneously inserted into the reaction tube 2 through a gate valve 10a, the transfer jigs 11 are lowered at a predetermined position, and the wafers 3 are transferred onto the supporting plates 8a and 8b. For this purpose, the supporting plates 8a and 8b are provided with slits at positions thereof where the transfers jig 11 vertically pass through. Since a single wafer or small number of wafers processing oxidizing apparatus having the same shape as that of this single wafer or small number of wafers processing CVD apparatus does not use the rectangular supporting plates, a wafer is placed directly on the base 20 disposed in the reaction tube 2, and processed as shown in FIG. 18.

Influence or affection by generation of the above mentioned slip lines are not so serious in a thermal CVD process in which a wafer is processed at a relatively low temperature of 900° C. or lower, but such influence or affection becomes serious in a process such as oxidization, anneal or epitaxial growth requiring a processing temperature of 900° C. or higher.

This point will be explained in more detail with reference to FIGS. 19 and 20. FIG. 19 is a numerical graph showing a difference in temperature rise between wafer center and wafer edge when wafers are inserted in the reaction furnace. FIG. 20 is a numerical graph showing a temperature distribution of wafer face when the transfer jig is inserted into the reaction furnace to take out high temperature heated wafers. As shown in FIG. 19 and FIG. 20, the temperature deviation generated in the wafer face is increased when the wafers are inserted into the reaction tube and when the wafers are retrieved from the reaction tube, but main reasons of the temperature deviation are different between when the wafers are inserted and when the wafers are retrieved. FIG. 19 shows a difference in temperature rise between the wafer center and wafer edge when the wafers are inserted. In FIG. 19, the horizontal axis shows a lapse of time, and the vertical axis shows temperature. In the heating process after the wafers are inserted, the temperature rise of the wafer edge is faster than the wafer center. This is because of the following, two reasons: (1) since two wafers are simultaneously processed, the wafer center is heated from its one side, but in the case of the wafer edge, radiation enters from a clearance between the two wafers so that the wafer edge is heated from both sides, (2) since the central portion of the heater is more cooled by the inserted wafers, temperature drop around the central portion of the heater is greater than that of the wafer edge. In FIG. 20, the horizontal axis shows positions within a wafer perpendicular to the transferring direction of the wafers (the center of the wafer is 0), and the vertical axis shows temperature of wafer. FIG. 20 shows calculated result in which the wafers and the transfer jig are located in the furnace from 0 to 5 seconds, and after that, they are retrieved or taken out from the furnace. As shown in FIG. 20, while the wafers are being retrieved, the low temperature transfer jig (they are normally standing by outside the reaction furnace at a room temperature) approaches the high temperature wafers or partially contacts therewith, and the wafers are locally cooled so that a large temperature deviation is generated. As described above, it can be found that when the wafers are inserted into and retrieved from the reaction furnace, temperature difference of tens of degrees is generated in the wafer surface and the slip lines are prone to be generated at an extremely high probability.

Therefore, in order to solve the problem of generation of slip lines, or to reduce slip lines in the hot wall type single wafer or small number of wafers processing apparatus, it is important to achieve the following four points: (1) to prevent the temperature rise of wafer edge from becoming faster as compared with the wafer center when the wafers are inserted, (2) to reduce a local temperature deviation at the supporting points of the wafer when they are inserted, (3) to simultaneously prevent the temperature of wafer from being lowered locally by contact or approach of the transfer jig when the wafers are retrieved, and (4) to avoid, when the wafers are retrieved, the temperature deviation within the wafer face caused by the fact that temperature drop of the wafer edge becomes faster as compared with the wafer center contrary to the case when the wafers are inserted.

In the conventional art 3, a reduction in slip lines generated by the above described causes is not taken into account. Further, slip lines reducing methods disclosed in the other conventional arts have the following problems if they are applied to the single wafer or small number of wafers processing thermal treatment apparatus:

First, in the apparatus for holding two wafers vertically and processing the same disclosed in the conventional art 2, since the transfer jig also functions as the supporting mechanism of wafers, the transfer jig can not be retrieved out from the reaction furnace during processing of the wafers, and the reaction furnace can not be lidded. Further, the transfer jig is integrally formed with rings for the purpose of preventing the slip or is always used in a state where the transfer jig is assembled with the rings. The fact that this method can not be applied to a cluster unit which is necessary to partition the load lock chamber and the reaction furnace from each other by the gate valve or the like is not taken into account in this conventional art 2.

The technique disclosed in the conventional art 1 is for the lamp anneal apparatus in which the rings are always provided in the reaction chamber. Therefore, slip lines generated due to non-uniformity of temperature by approach or contact of the transfer jig when the wafers are inserted or retrieved, i.e., the above mentioned point 3 is not taken into account.

SUMMARY OF THE INVENTION

Thereupon, in a single wafer or couple of wafers processing thermal treatment semiconductor processing apparatus for holding the wafers substantially horizontally and processing the same, it is a main object of the present invention to provide a semiconductor processing apparatus capable of preventing slip lines from being generated in a wafer, or reducing the generation of the slip lines.

According to a first aspect of the present invention, there is provided a semiconductor wafer processing apparatus, comprising:

a reaction furnace capable of heating inside thereof;

a wafer mount for mounting a semiconductor wafer thereon, the wafer mount including an opening which is greater than the semiconductor wafer and which has a circle shape or a shape substantially similar to an outer periphery of the semiconductor wafer, and including a wafer supporting portion projecting inwardly of the opening for supporting the semiconductor wafer; and a transfer device, for transferring the wafer mount carrying the semiconductor wafer thereon substantially horizontally into and/or out from the reaction furnace, the transfer device being capable of holding the wafer mount outside the semiconductor wafer as viewed from a vertical direction.

According to a second aspect of the present invention there is provided a method for manufacturing a semiconductor device comprising the steps of:

mounting a semiconductor wafer on a wafer mount, the wafer mount including an opening which is greater than the semiconductor wafer and which has a circle shape or a shape substantially similar to an outer periphery of the semiconductor wafer, and including a wafer supporting portion projecting inwardly of the opening for supporting the semiconductor wafer; and transferring the wafer mount by a transfer device for transferring the wafer mount carrying the semiconductor wafer thereon into and/or out from the reaction furnace, the transfer device being capable of holding the wafer mount outside the semiconductor wafer as viewed from a vertical direction;

processing the semiconductor wafer while heating the semiconductor wafer in the reaction furnace; and forming a semiconductor device in or on the semiconductor wafer.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Embodiments of the present invention will be explained below.

[First Embodiment]

Figure 1:
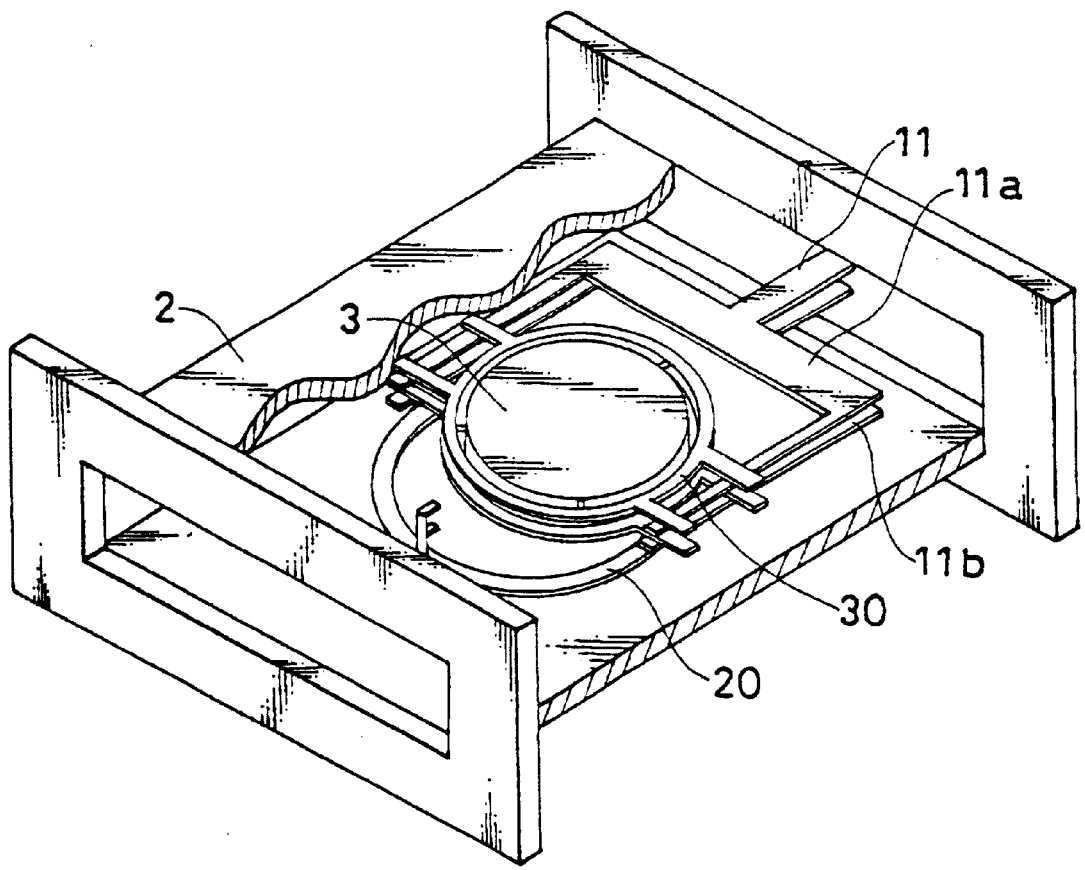
FIG. 1 is a perspective view showing a state where wafers are being inserted into or retrieved from a reaction furnace of a single wafer or couple of semiconductor wafers processing thermal treatment apparatus according to a first embodiment of the present invention.

A first embodiment of the present invention will be explained with reference to FIGS. 1 and 2. FIG. 1 is a view most preferably showing the features of the first embodiment of the invention, and is a broken perspective view showing a state where wafers are being inserted in or retrieved from a reaction furnace of a single wafer or couple of wafers processing apparatus according to the first embodiment of the invention. FIG. 1 shows the process of inserting wafers 3 into or retrieving wafers 3 from a reaction tube 2.

Figure 2:
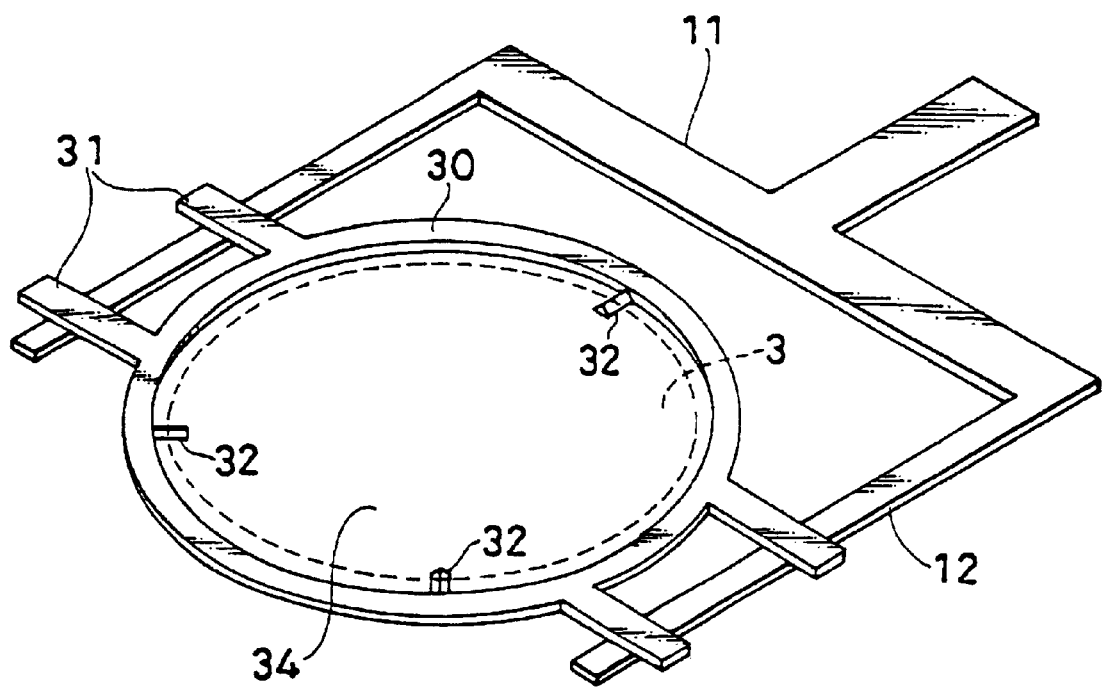
FIG. 2 is a perspective view showing shapes of a supporting member and a transfer jig of the single wafer or couple of semiconductor wafers processing thermal treatment apparatus shown in FIG. 1.

Further, FIG. 2 is a perspective view showing shapes of a supporting member and a transfer jig of the semiconductor processing apparatus shown in FIG. 1, in which a supporting member 30 and a transfer jig 11 are enlarged. Here, since the supporting member (supporting plate) 8 which is a constituent element of the conventional single wafer or small number of wafers processing CVD apparatus explained using FIGS. 15 to 18 is different from the supporting member 30 of the present invention in structure and function, different number is allocated to the supporting member in view of the difference.

Figure 3:
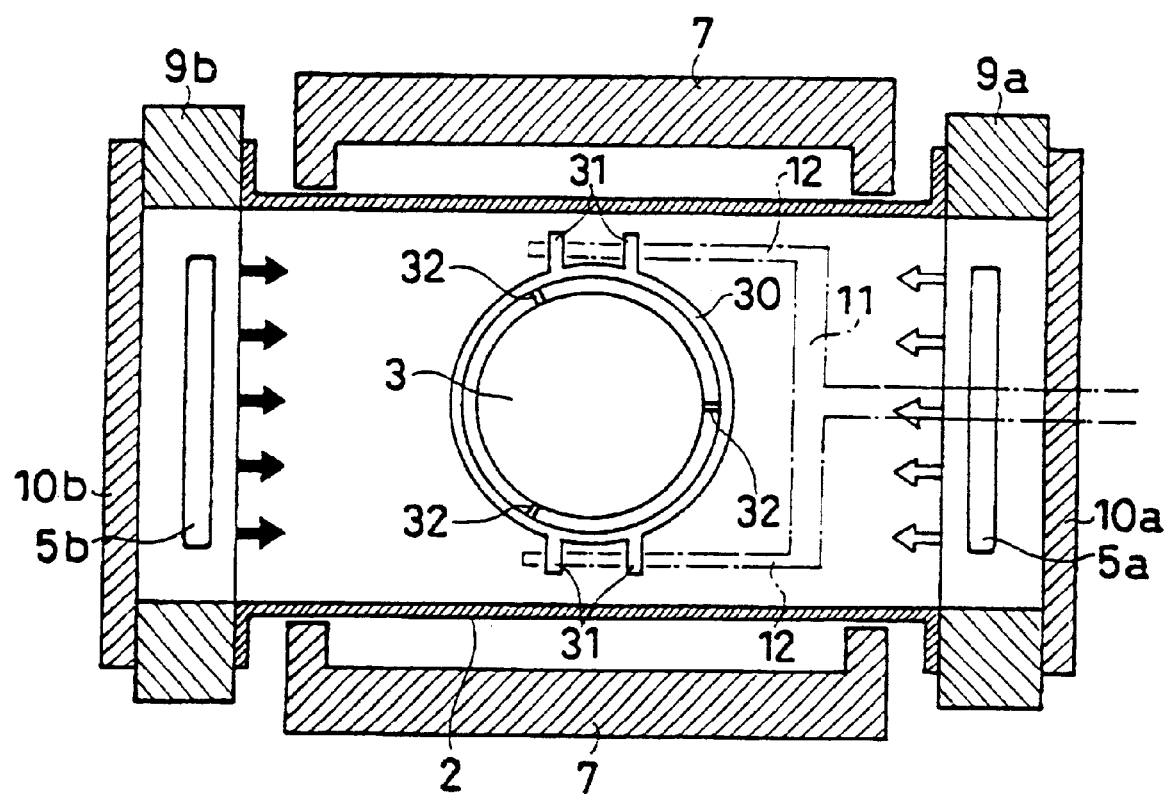
FIG. 3 is a transverse cross sectional view for explaining a structure of the single wafer or couple of semiconductor wafers processing thermal treatment apparatus used in embodiments of the present invention.
Figure 4:
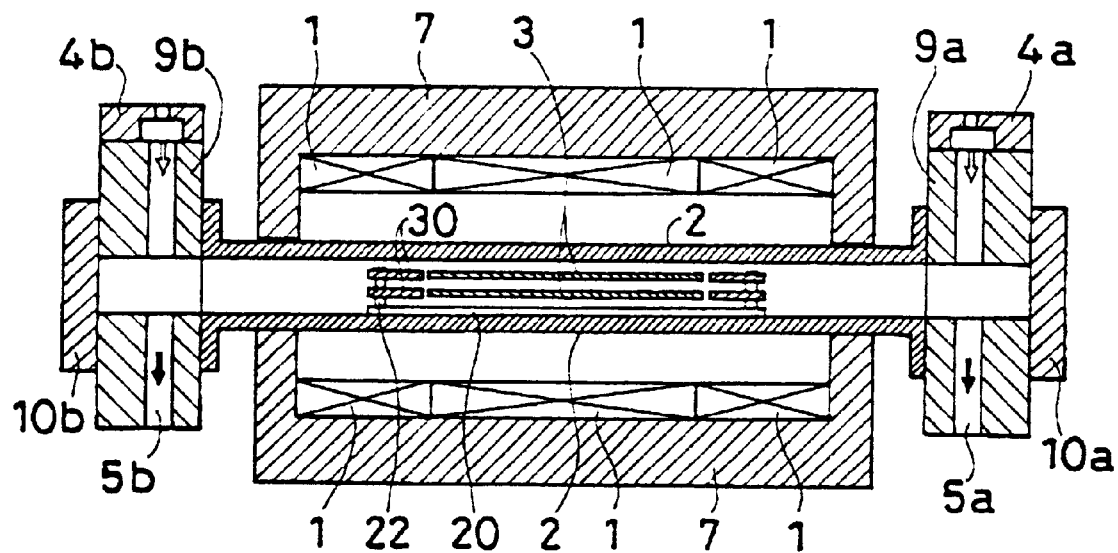
FIG. 4 is a vertical cross sectional view for explaining a structure of the single wafer or couple of semiconductor wafers processing thermal treatment apparatus used in the embodiments of the present invention.

FIGS. 3 and 4 are a transverse cross sectional view and a vertical cross sectional view, respectively, for explaining a structure of the single wafer or couple of semiconductor wafers processing thermal treatment apparatus used in the embodiment of the present invention.

The reaction furnace of this single wafer or couple of wafers processing thermal treatment semiconductor apparatus is of a hot wall type, and includes a reaction tube 2, flat plate heaters 1 and 1 disposed above and below the reaction tube 2, heat insulators 7 for covering the flat plate heaters 1 and 1 and the reaction tube 2, flanges 9a and 9b provided at opposite ends of the reaction tube 2, and gate valves 10a and 10b provided outside the flanges 9a and 9b, respectively. Each of the upper and lower flat plate heaters 1 and 1 is divided into a plurality of zones. The structure of the reaction furnace is the same in all of embodiments.

A base (holding member) 20 is provided in the reaction tube 2, two supporting members (wafer mount) 30 and 30 are disposed on the base 20 such that the supporting members 30 and 30 are superposed one above the other in the vertical direction. A semiconductor wafer 3 is horizontally mounted on each of the supporting members 30 and 30. A transfer jig (transfer device) 11 comes in and out from the reaction tube 2 through the gate valve 10a so as to simultaneously insert, into the reaction tube 2, the two supporting members 30 and 30 on which the semiconductor wafers 3 and 3 are respectively mounted while keeping a state where the supporting members 30 and 30 are vertically superposed one above the other, and so as to simultaneously retrieve, from the reaction tube 2, the two supporting members 30 and 30 on which the semiconductor wafers 3 and 3 are respectively mounted while keeping a state where the supporting members 30 and 30 are vertically superposed one above the other. In a state where an inside of the reaction tube 2 is heated by the heaters 1 and 1, the two supporting members 30 and 30 on which the semiconductor wafers 3 and 3 are respectively mounted are inserted into the reaction tube 2, the supporting members 30 and 30 are mounted on the base 20 to process the semiconductor wafers 3 and 3, and then, the supporting members 30 and 30 on which the semiconductor wafers 3 and 3 are respectively mounted are retrieved.

When the semiconductor wafers 3 and 3 are processed, processing such as film formation on the semiconductor wafer 3 is conducted while supplying a gas from gas supply ports 4 (4a and 4b) and discharging the gas from exhaust ports 5 (5b and 5a) which are provided on the opposite side to the gas supply ports 4 (4a and 4b) (the gas flows in parallel to the wafer 3 as shown with white or black arrow in the drawing). A flow of gas supplied from the gas supply port 4a and discharged from the exhaust port 5b, and a flow of gas supplied from the gas supply port 4b and discharged from the exhaust port 5a are alternately switched.

Next, shapes of the supporting member 30 and the transfer jig 11 are explained. The supporting member 30 is formed into a ring-shape provided at its central portion with an opening 34 larger than the wafer 3. The opening 34 is provided with at least three wafer supporting portions 32 extending inward. The wafer 3 is placed on the supporting member 30 such that the wafer 30 is held by the wafer supporting portions 32 using a loading mechanism (not shown) The supporting member 30 is provided at its sides with arms (projections) 31 extending sideward, and is placed on the transfer jig 11 through the arms 31 and transferred. The transfer jig 11 comprises diverged transfer jig tip end portions (arms) 12 and a body fixed to a transfer mechanism (not shown), and the diverged transfer jig tip end portions 12 of the transfer jig 11 support the arms 31 from below, and the transfer jig 11 transfers the supporting member 30 and the wafer 3 supported thereby. At that time, the transfer jig 11 is formed into a shape such that none of the portion of the transfer jig 11 enters a cylindrical region formed by normal line with respect to a wafer surface passing the peripheral end of the wafer 3 and an inner wall surface of the reaction tube 2. That is, a distance between the tip ends 12 and 12 of the transfer jig is greater than a diameter of the semiconductor wafer 3, and the transfer jig 11 supports the supporting member 30 outside the semiconductor wafer 3 if the supporting member 30 on which the semiconductor wafer 3 is horizontally mounted is viewed from the vertical direction. In the present embodiment, since the wafer 3 does not have an orientation flat, the opening 34 of the supporting member 30 is circle in shape. However, if a wafer having a shape other than circle such as a wafer having an orientation flat, it is preferable that the opening 34 has a shape similar to a wafer.

Next, procedure for inserting the wafers 3 will be explained. In the present embodiment, the two wafers 3, 3 are respectively placed on the supporting members 30, 30 and are supported by the transfer jigs 11, 11 together with the supporting members 30, 30. The two sets of such the wafer 3, the supporting member 30 and the transfer jig 11 are vertically superposed one above the other at distances from one another, and are standing by outside the reaction tube 2. Thereafter, these two sets are inserted into the reaction tube 2 at a high speed of 100 mm/sec or higher. After they are inserted into the reaction tube 2, the transfer jigs 11 are lowered by about several millimeters for example so that the supporting members 30 and 30 and the wafers 3 and 3 are loaded on the base 20 and then, only the transfer jigs 11 are retrieved from the reaction tube 2. Then, the wafers 3 and 3 are heated by upper and lower heaters 1 and 1.

Next, temperature distribution generated in the wafers 3 when they are heated will be explained. When the wafers 3 are heated, the wafer center is heated from one side thereof such that the upper wafer 3 is heated from above and the lower wafer 3 is heated from below by heat radiation from the heaters 1. Whereas, the edges of the two wafers 3, 3 are heated such that the upper wafer 3 is heated from above and the lower wafer 3 is heated from below by heat radiation from the heaters 1 and in addition, the edges of these wafers 3 are also heated by heat radiation entering from a clearance between the two wafers 3. However, since the supporting members 30 are located at peripheries of the wafers 3, the amount of heat radiation entering from the clearance is restricted as compared with a case in which the supporting members 30 are not used. Further, since heat capacity of the supporting member 30 is greater than that of the wafer 3 and thus the temperature rise of the supporting member 30 becomes slow, heat of periphery of the wafer 3 is radiated to the supporting member 30. With these two effects, the wafer edge temperature and the wafer center temperature become substantially equal to each other. In such a mechanism, in order to uniform the wafer temperature when it is inserted, a shape of the supporting member 30, especially the heat capacity and the emissivity (absorptivity) largely affect the uniformity of the wafer temperature. Therefore, it is of course necessary to optimize these parameters when the supporting member 30 is designed. Further, it has been described that the number of transfer jigs 11 is two in the present embodiment, if a distance between the wafers 3 is fixed, root portions of the transfer jigs 11a and 11b may be integrally formed. Alternatively, the transfer jigs may be fixed to one identical transfer mechanism, and may be substantially integrally formed.

The wafers 3 are retrieved in accordance with a procedure basically opposite to the insertion procedure except that the wafers 3 and the supporting members 30 are at a high temperature. The transfer jigs 11 are at a low temperature as in the case when they are inserted.

However, as described above, the transfer jigs 11 are inserted into positions not directly facing the wafers 3 placed in the reaction tube 2, and hold the arms 31 of the supporting members 30 without directly contacting with the wafers 3 and transfer them. Therefore, it is possible to prevent the wafers 3 which are heated to a high temperature from being abruptly cooled by the transfer jigs 11 having a great temperature difference from the wafers 3 and therefore, it is possible to prevent slip lines from being generated in the wafers 3. With the above explained mechanism, it is possible to reduce the temperature deviation generated within the wafer face and to prevent slip lines from being generated in both insertion process and retrieval process of the wafer.

Figure 5:
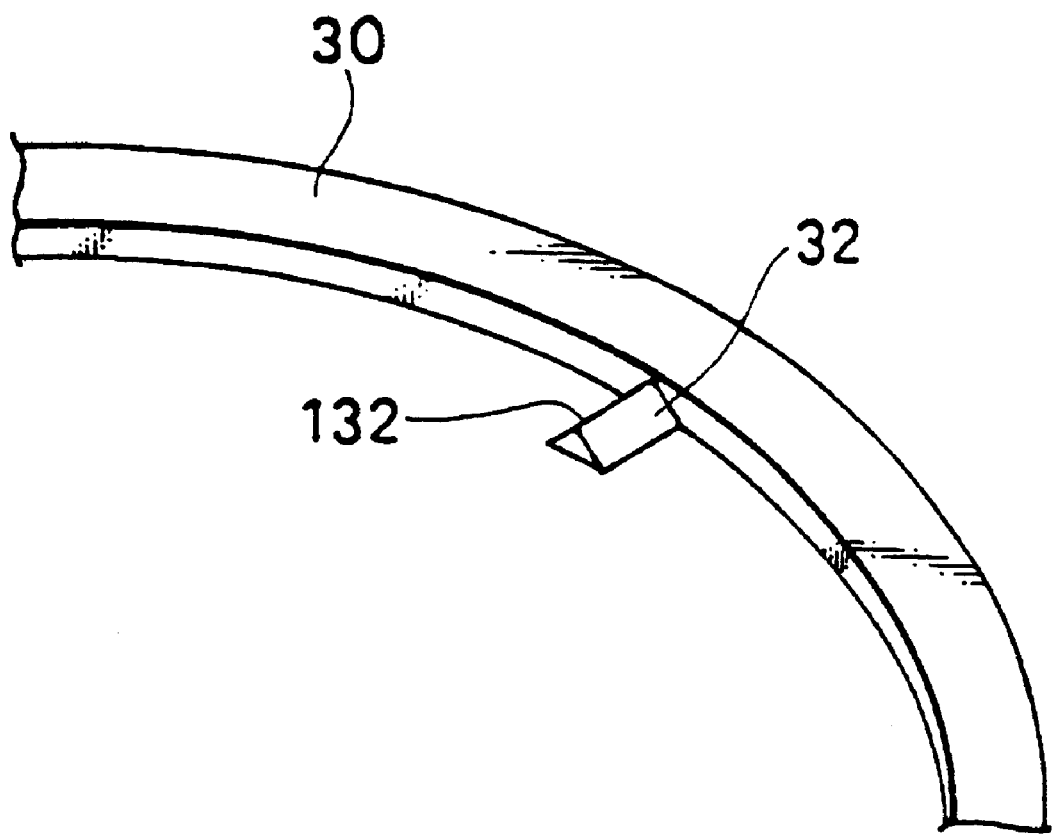
FIG. 5 is a partially enlarged perspective view showing a shape of a supporting portion of the supporting member of the single wafer or couple of semiconductor wafers processing thermal treatment apparatus shown in FIG. 1.
Figure 6:
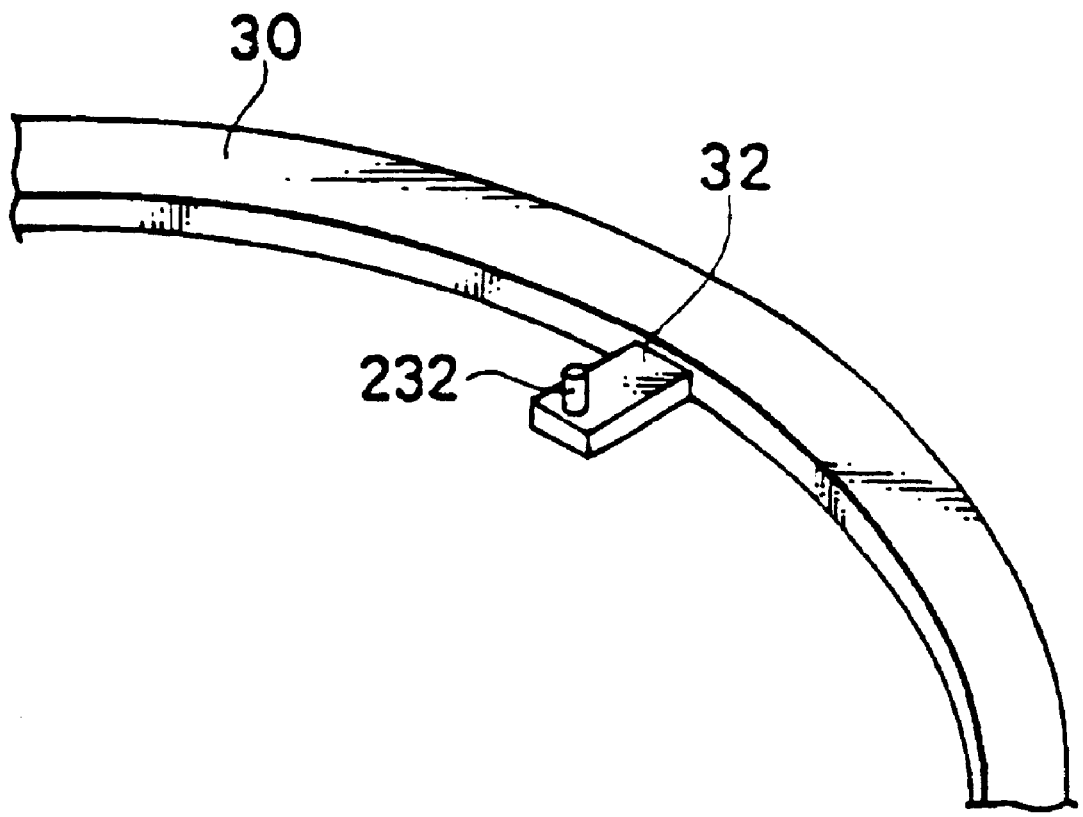
FIG. 6 is a partially enlarged perspective view showing a shape of another supporting portion of the supporting member of the single wafer or couple of semiconductor wafers processing thermal treatment apparatus shown in FIG. 1.

Next, holding portions of the supporting member 30 for the wafer 3 will be explained with reference to FIGS. 5 and 6. FIG. 5 is a perspective view showing a shape of the supporting portion 32 of the supporting member 30 of the semiconductor processing apparatus shown in FIG. 1, and FIG. 6 is a perspective view showing a shape of another supporting portion 32 of the supporting member 30 of the semiconductor processing apparatus shown in FIG. 1. FIG. 5 shows a case in which the supporting portion 32 is of a triangular prism shape, and it is fixed to the supporting member 30 such that an edge line 132 of the triangular prism comes upside. The wafer 3 is supported such that the back surface of the wafer 3 is contacted with the edge line 132. It is preferable that a length of the supporting member 32 contacting with the back surface of the wafer 3 is the necessary but minimum length. Such a length is normally 10 mm or less, and more preferably 5 mm or less. The supporting member 32 shown in FIG. 6 has a thin plate having a rectangular cross section, and thin pins 232 are mounted on a tip end of an upper surface of the thin plate. The wafer 3 is held on the pins 232. With such a supporting member 32, it is possible to reduce a contacting area between the wafer 3 and the pin 232 to reduce the local temperature deviation. Preferable examples of material of the supporting member 30 are quartz, SiC, alumina, silicon and ceramics. Other preferable example of material of the supporting member 30 are quartz, Sic, alumina, silicon, ceramic and the like all of which are coated with silicon or SiC. However, if the material can withstand a high temperature, it is not limited to the above examples. Silicon or SiC can be coated using the CVD process.

Figure 7:
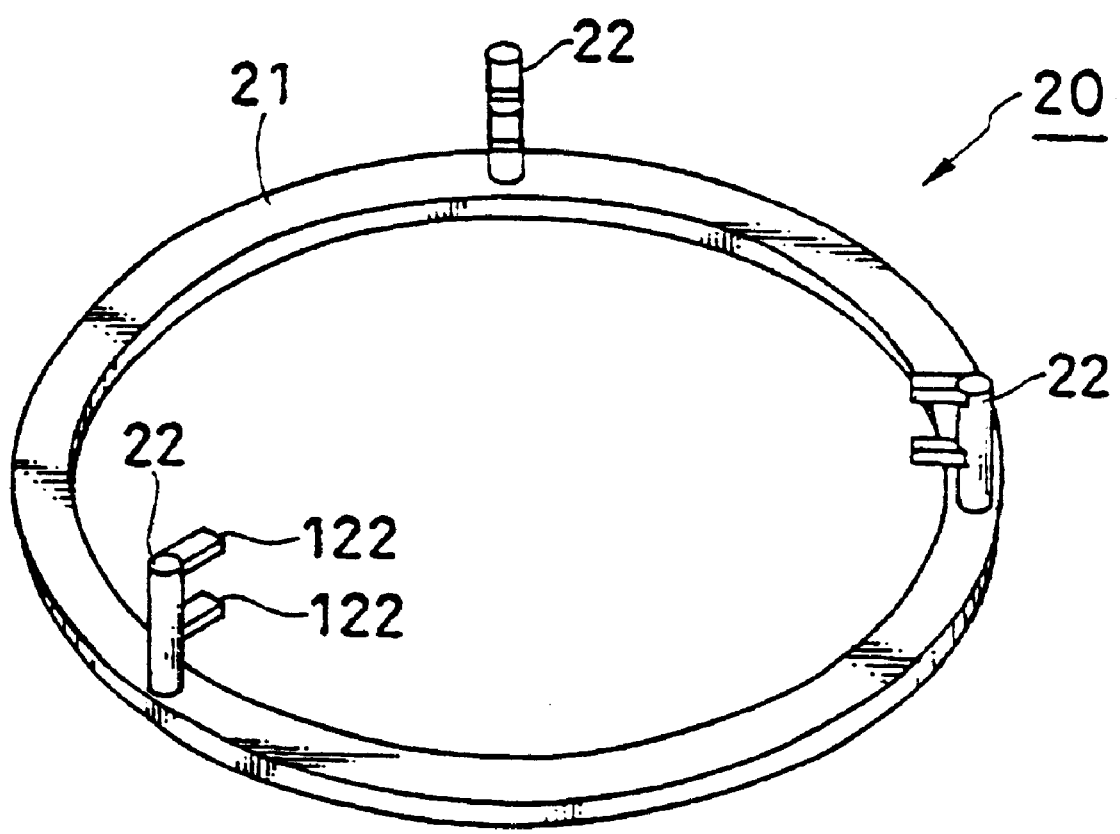
FIG. 7 is a perspective view showing a shape of a base of the single wafer or couple of semiconductor wafers processing thermal treatment apparatus shown in FIG. 1.

FIG. 7 shows a detailed shame of the base 20 supporting the supporting members 30 in the reaction tube 2. At least three holding portions 22 are mounted on a ring-like base 21. Each of the holding portions 22 has beams 122 capable of holding the wafer and the supporting member 30 such that they are superposed one above the other in the vertical direction. The number of beams 122 depends on the usage of the apparatus, and is determined by a designer depending on the maximum number of wafers that the apparatus processes simultaneously. In the present embodiment, the supporting members 30 and the base 20 are separate members, and the base 20 is always kept inserted in the reaction tube 2.

[Second Embodiment]

Figure 8:
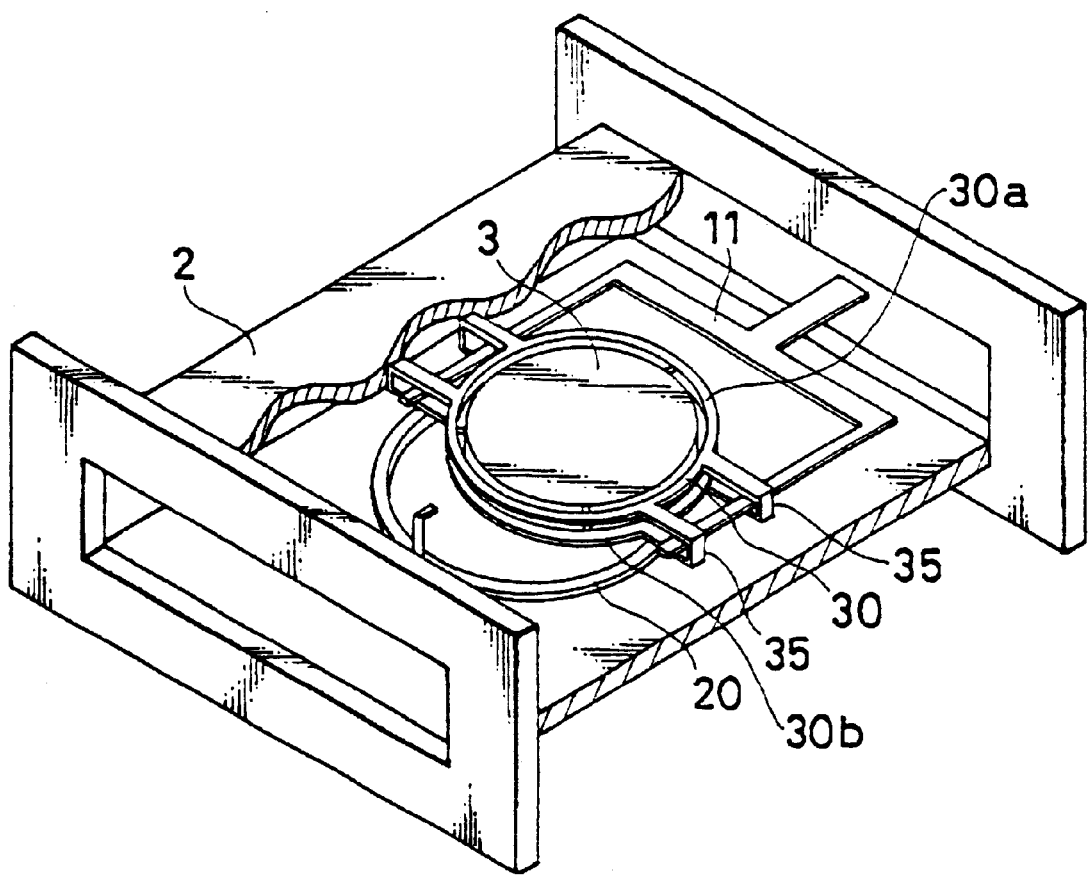
FIG. 8 is a perspective view showing a state where wafers are being inserted in or retrieved from a reaction furnace of a single wafer or couple of semiconductor wafers processing thermal treatment apparatus according to a second embodiment of the present invention.

In a single wafer or couple of wafers processing thermal treatment apparatus of the present invention, the supporting member 30 may be formed into a shape as shown in FIG. 8. FIG. 8 shows the supporting member 30 of a semiconductor processing apparatus of the second embodiment of the present invention, and is a broken perspective view showing a state where the wafers 3 are being inserted into or retrieved from the reaction tube 2. The second embodiment is an example in which the two supporting members 30 explained in the first embodiment are formed integrally. That is, two supporting members 30a and 30b are integrally formed with each other by means of a connection portion 35. After the supporting members 30a and 30b are inserted into the reaction tube 2 with one transfer jig, they are transferred onto the base 20 in the reaction tube 2 and processed.

[Third Embodiment]

Figure 9:
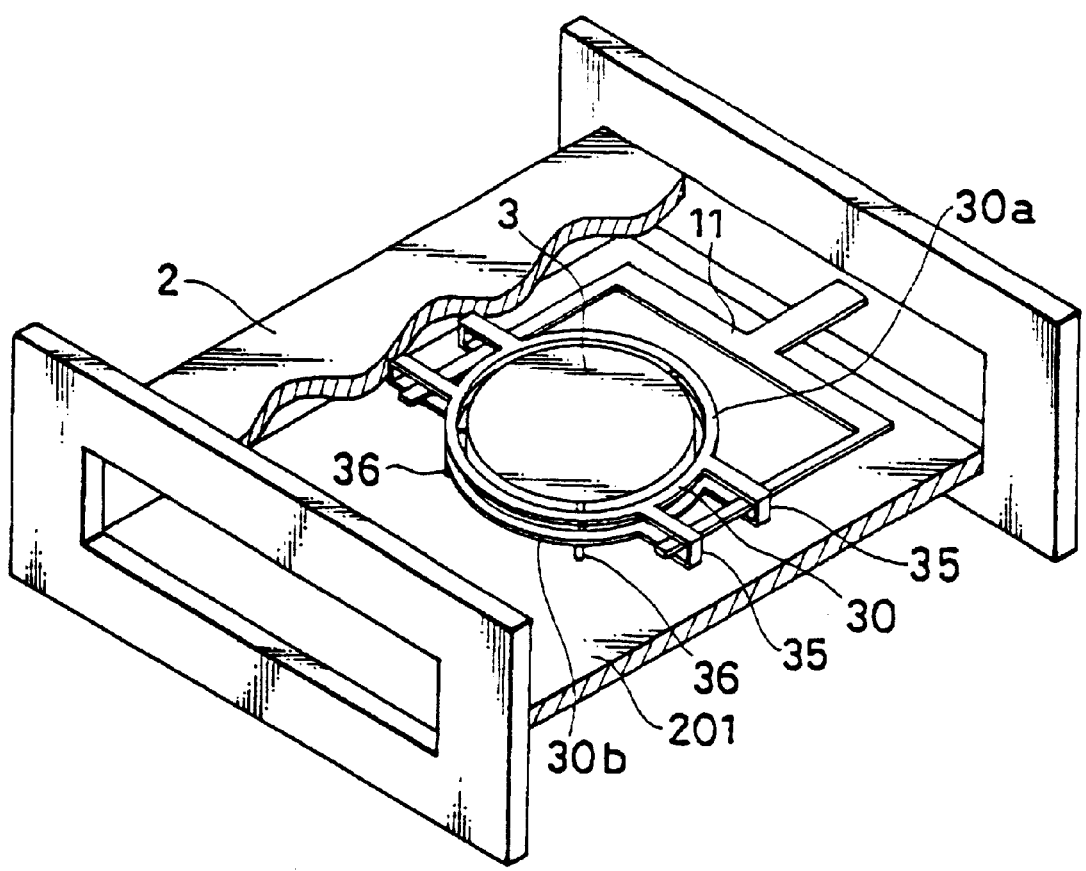
FIG. 9 is a perspective view showing a state where wafers are being inserted in or retrieved from a reaction furnace of a single wafer or couple of semiconductor wafers processing thermal treatment apparatus according to a third embodiment of the present invention.

Further, the supporting member 30 may be formed into a shape as shown in FIG. 9. FIG. 9 shows the supporting member 30 of a semiconductor processing apparatus of the third embodiment of the present invention, and is a perspective view showing a state where the wafers 3 are being inserted into or retrieved from the reaction tube 2. In the third embodiment, the supporting member 30 comprises two supporting members 30a and 30b which are integrally formed with each other by means of the connection portion 35, and includes a plurality of legs 36. After the supporting member 30 is inserted into the reaction tube 2 by the transfer jig 11, the supporting member 30 is placed directly on a lower side inner wail surface 201 of the reaction tube 2. A length or height of each of the legs 36 is set such that the wafer 3 is located at a predetermined height when the supporting member 30 is loaded in the reaction tube 2.

[Fourth Embodiment]

Figure 10:
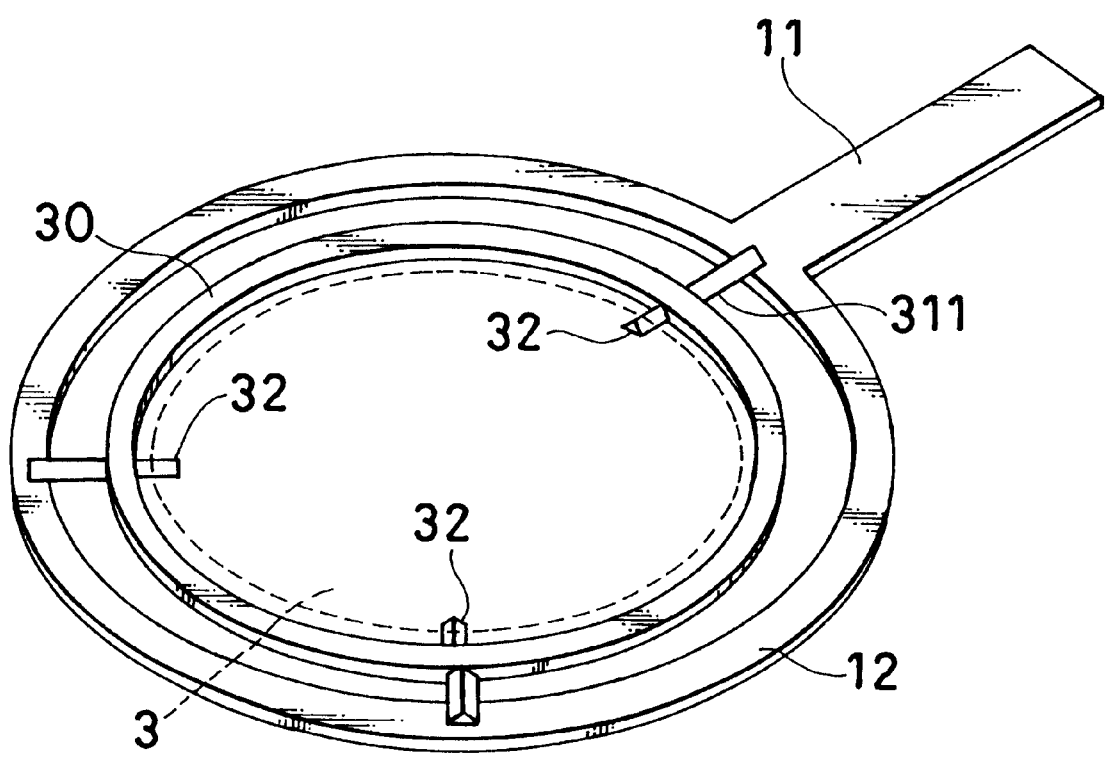
FIG. 10 is a perspective view showing shapes of a supporting member and a transfer jig of a single wafer or couple of semiconductor wafers processing thermal treatment apparatus of a fourth embodiment of the present invention.

A single wafer or couple of wafers processing thermal treatment apparatus of a fourth embodiment of the present invention will be explained with reference to FIG. 10. FIG. 10 is a perspective view showing shapes of the supporting member 30 and the transfer jig 11 of a semiconductor processing apparatus of the fourth embodiment of the present invention. The fourth embodiment is different from the first embodiment in that a tip end 12 of the transfer jig 11 supporting the supporting member 30 is formed into a ring-shape. FIG. 10 shows the transfer jig 11 and the supporting member 30 only.

The merit of the ring-shaped tip end of the transfer jig 11 is as follows. That is, in the single wafer or couple of wafers processing thermal treatment apparatus to which the present invention is applied, it is necessary to insert the wafer 3 at a high speed so as to uniform the temperature of the wafer 3. Therefore, moving speed of the transfer jig 11 is as fast as 100 mm/sec or higher. Taking this fact into consideration, if the transfer jig 11 is formed into a ring-shape, a portion of the transfer jig 11 passes through below the wafer 3, but such a passing time can be considerably shortened (1 to 2 seconds), effect which disturbs the temperature uniformity within the face of the wafer 3 can be negligible, and thermal stress dislocation is not generated.

In summary, the tip end 12 of the transfer jig 11 may be formed into any shape if none of the portion of the transfer jig 11 enters a phantom cylindrical region formed by normal line with the surface of the wafer 3 passing the peripheral end of the wafer 3 and an inner wall surface of the reaction tube 2, that is, the transfer jig 11 supports the supporting member 30 outside the semiconductor wafer 3 when the supporting member 30 on which the semiconductor is horizontally mounted is viewed from the vertical direction. Therefore, although the tip end of the transfer jig 11 is formed into the ring-shape in the present embodiment, the shape of the tip end is not limited to the ring-shape only.

[Fifth embodiment]

Figure 11:
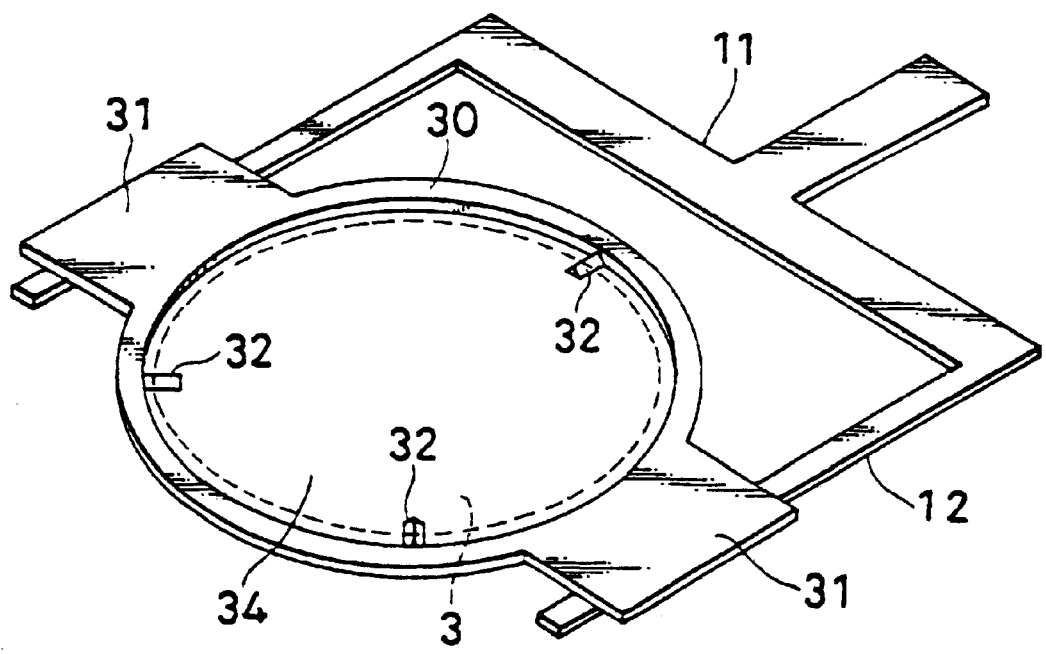
FIG. 11 is a perspective view showing shapes of a supporting member and a transfer jig of a fifth embodiment of the single wafer or couple of semiconductor wafers processing thermal treatment apparatus according to the present invention.

FIG. 11 is a perspective view showing shapes of a supporting member 30 and a transfer jig 11 of a fifth embodiment of the single wafer or couple of wafers processing thermal treatment semiconductor apparatus according to the present invention.

Although the two arms (projections) 31 are projected from each of the two sides of the supporting member 30 in the first embodiment, the present fifth embodiment is different from the first embodiment in that a single plate-like projection 31 is projected from each of the two side of the supporting member 30, and other structures are the same. If such a plate-like projection 31 is provided, working is simple.

[Sixth embodiment]

Figure 12:
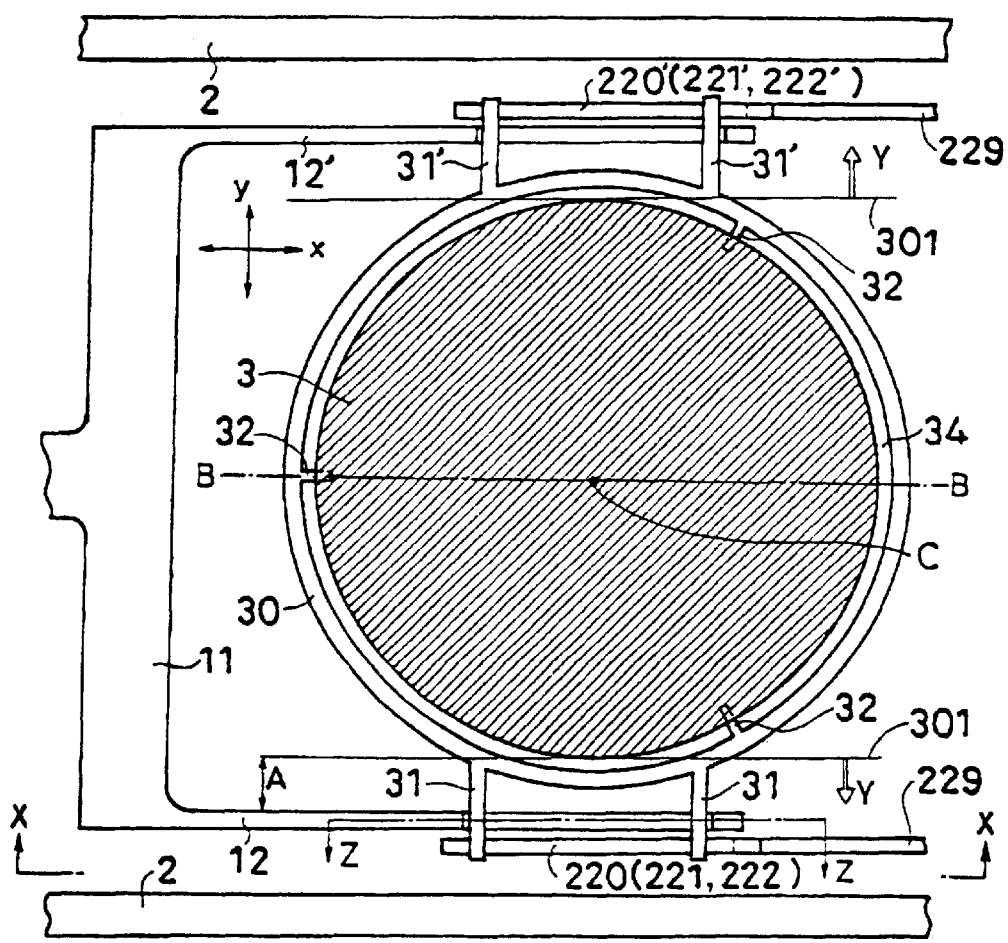
FIG. 12 is a transverse cross sectional view showing shapes of a supporting member and a transfer jig of a sixth embodiment of the single wafer or couple of semiconductor wafers processing thermal treatment apparatus according to the present invention.
Figure 13:
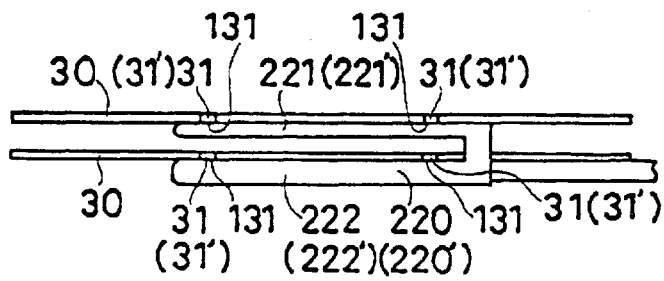
FIG. 13 is a view taken along the arrows X—X in FIG. 12.
Figure 14:
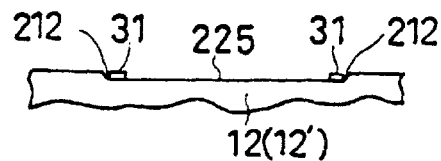
FIG. 14 is a cross sectional view taken along the line Z—Z in FIG. 12.
Figure 15:
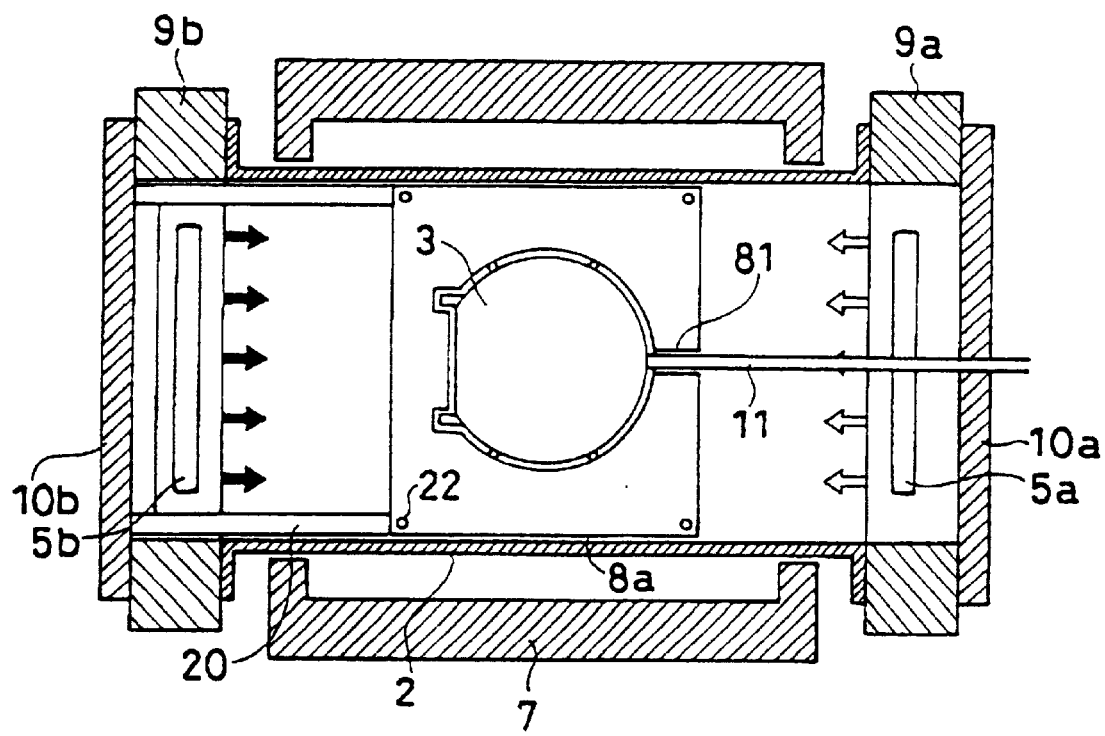
FIG. 15 is a cross-sectional view of a reaction furnace of a conventional horizontally supporting single wafer or small number of wafers processing CVD apparatus as viewed from above.
Figure 16:
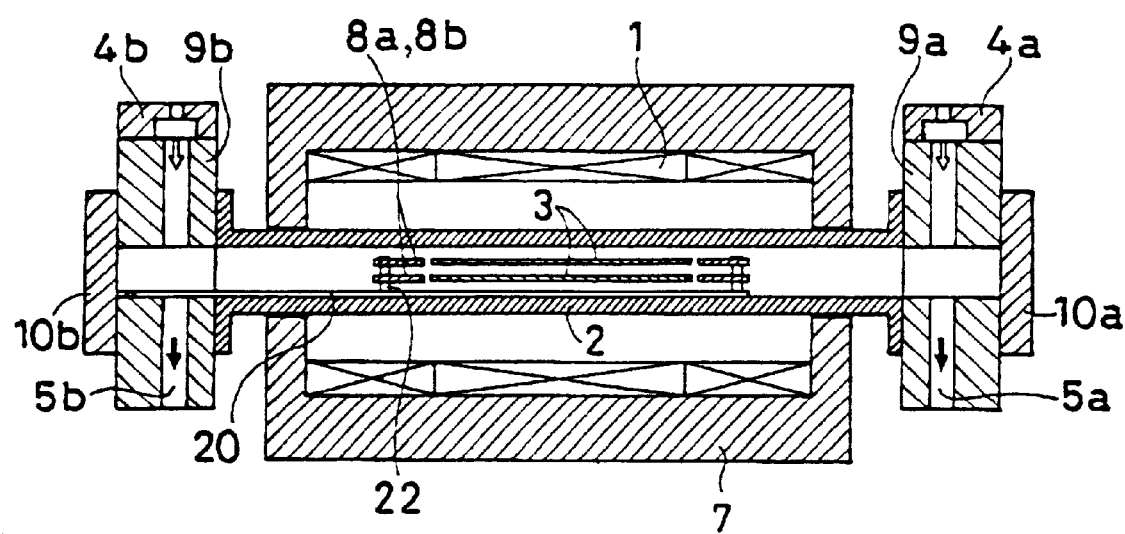
FIG. 16 is a vertical cross-sectional view of the reaction furnace of the conventional horizontally supporting single wafer or small number of wafers processing CVD apparatus as viewed from side.
Figure 17A:
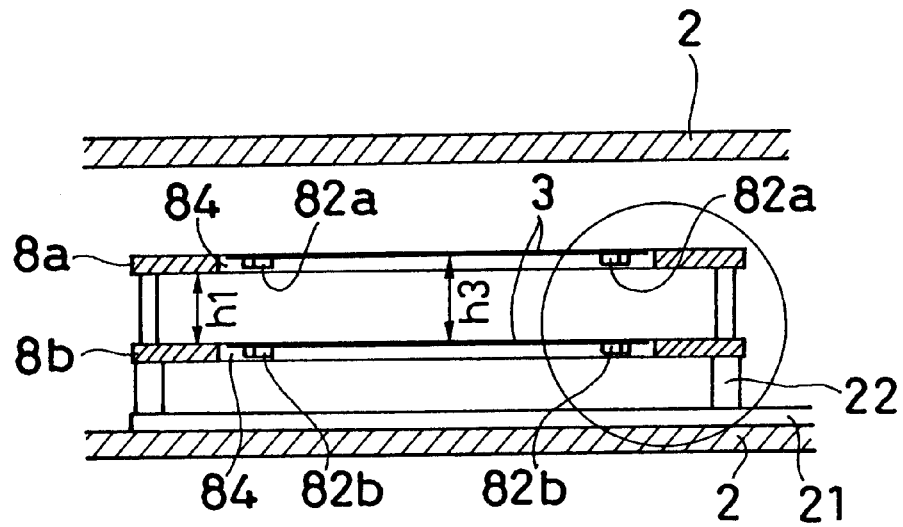
FIGS. 17a and 17b are vertical cross-sectional views of the reaction furnace of the conventional single wafer or small number of wafers processing CVD apparatus as viewed from side for showing a supporting method of wafers.
Figure 17B:
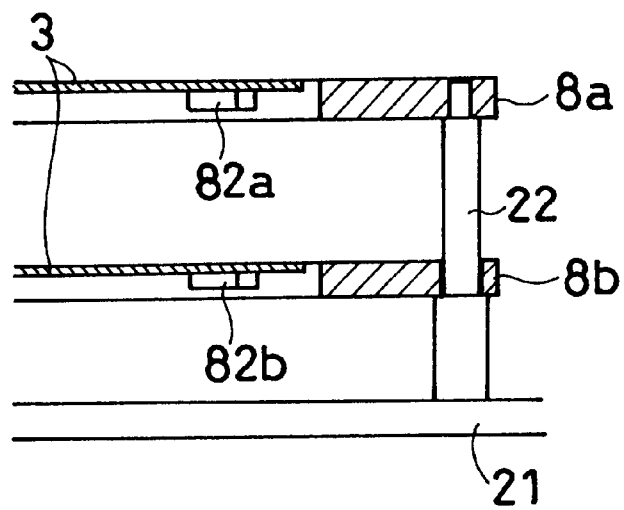
Figure 18:
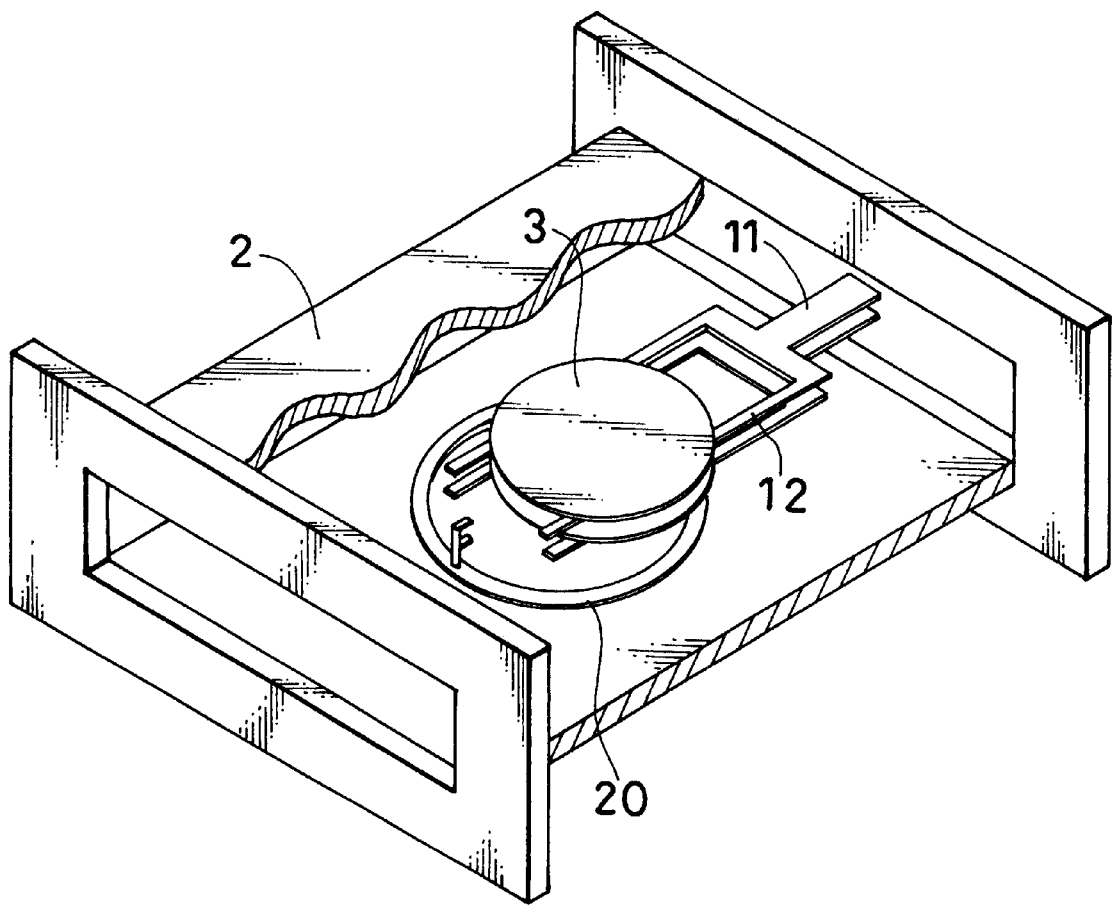
FIG. 18 is a perspective view showing a state where wafers are being inserted in or retrieved from a reaction furnace of a conventional horizontally supporting single wafer or couple of wafers processing oxidizing apparatus.
Figure 19:
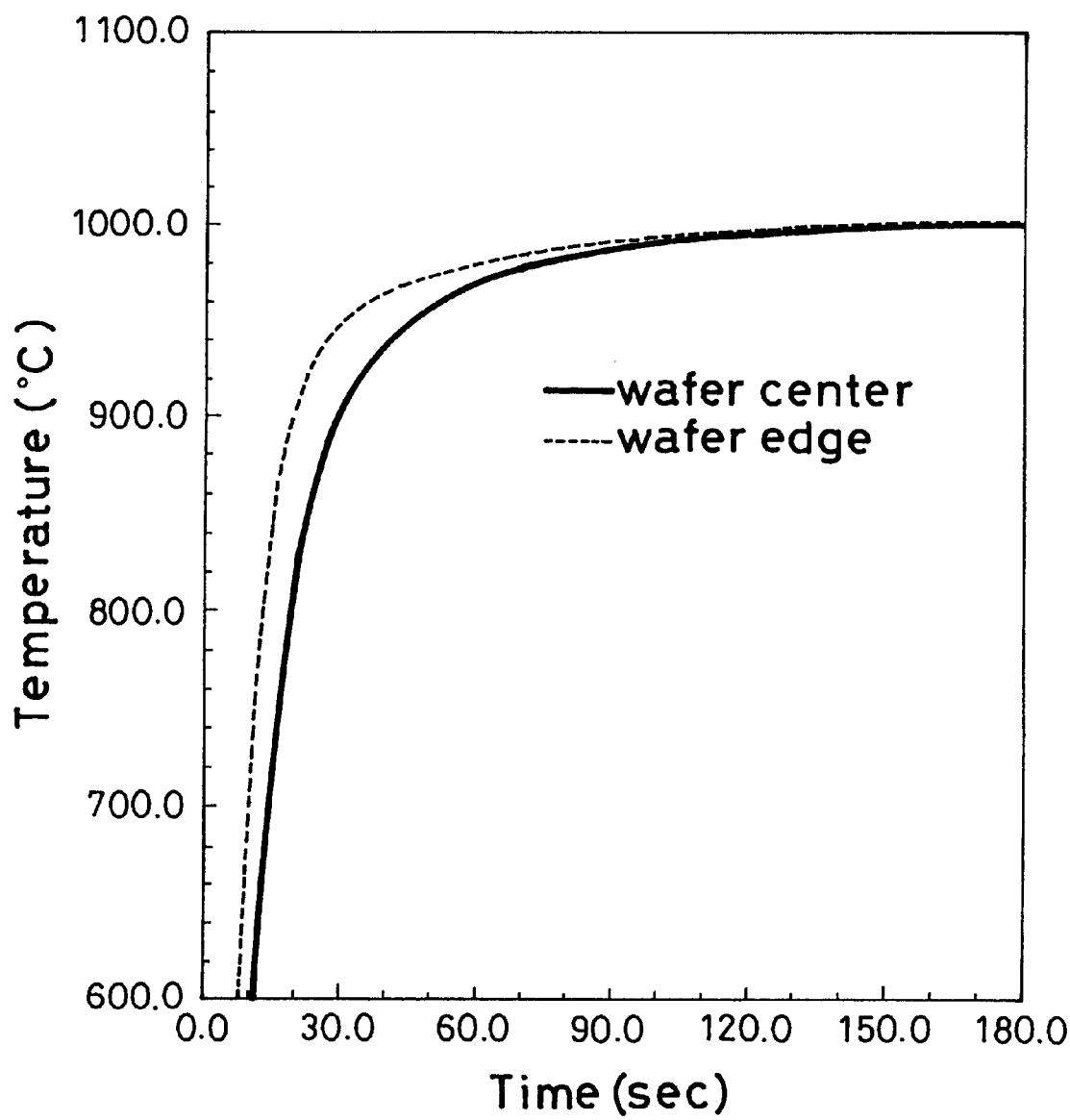
FIG. 19 is a numerical graph showing a difference in temperature rise between wafer center and wafer edge when wafers are inserted in a conventional horizontally supporting single wafer or small number of wafers processing CVD apparatus.
Figure 20:
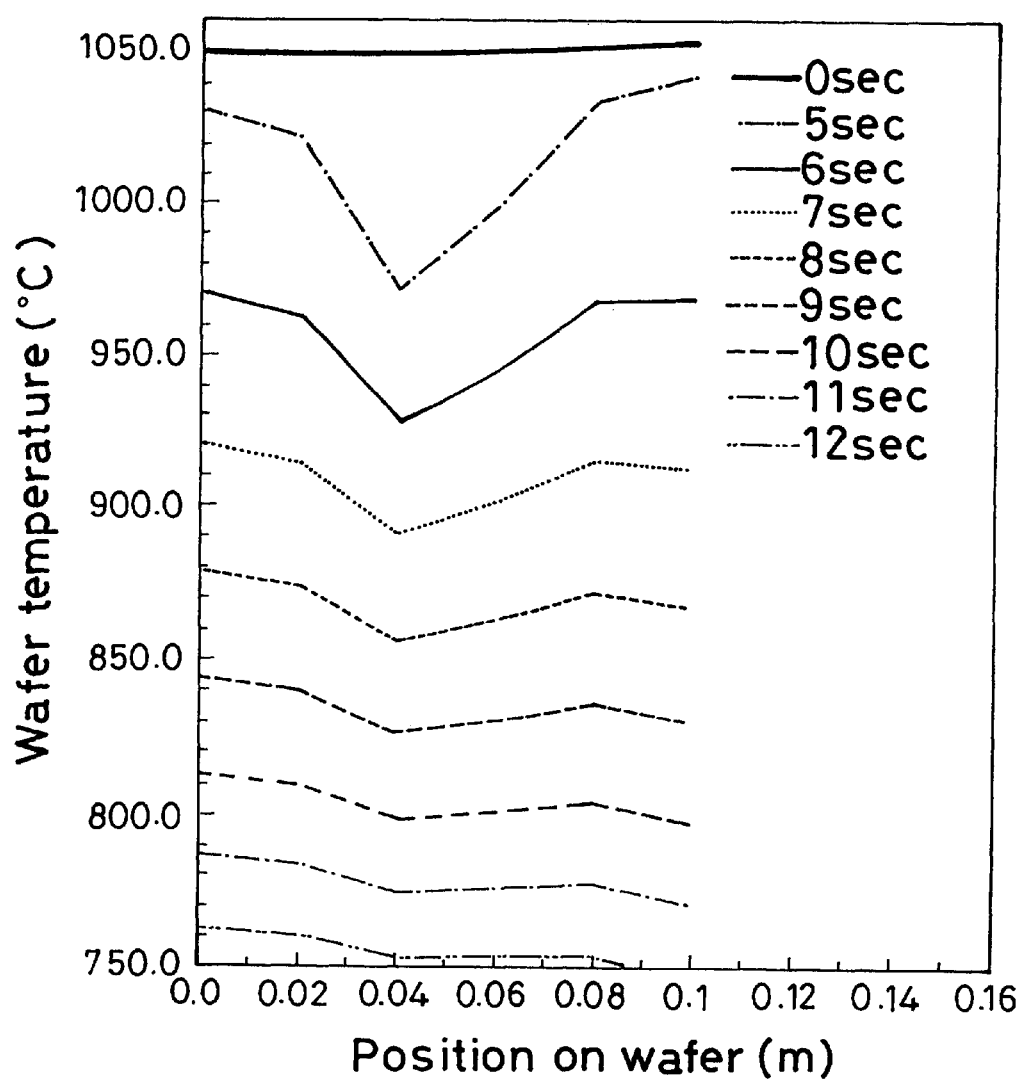
FIG. 20 is a numerical graph showing a temperature distribution of within a wafer face when the transfer jig is inserted into the reaction furnace at the time of retrieval of the wafer in the conventional horizontally supporting single wafer or small number of wafers processing CVD apparatus.

FIG. 12 is a transverse cross sectional view showing shapes of a supporting member and a transfer jig of a sixth embodiment of the single wafer or couple of semiconductor wafers processing thermal treatment apparatus according to the present invention.

In the present embodiment also, the same reaction furnace as explained in the first embodiment with reference to FIGS. 3 and 4 is used. A holding member 229 having two holding portions 220 and 220' is provided in the reaction tube 2. The two holding portions 220 and 220' include an upper holding portions 221, 221' and lower holding portions 222 and 222', respectively. The upper holding portions 221, 221' and the lower holding portions 222 and 222' are disposed in parallel to a transferring direction x of the semiconductor wafer 3.

The two supporting members (wafer mounts) 30 are superposed one above the other in the vertical direction. Each of the wafer mounts 30 is formed with a circle opening 34 greater than the semiconductor wafer 3, and is provided with three wafer supporting portions 32 which project inward of the opening 34. The semiconductor wafer 3 is horizontally supported in the opening 34 by the wafer supporting portions 32. The thus horizontally supported two semiconductor wafers 3 and 3 are superposed one above the other in the vertical direction.

An outside of each of the two wafer mounts 30 is circle in shape, and the wafer mount 30 is formed into a ring-shape. The wafer mount 30 is provided with four projections 31, 31, 31' and 31' projecting outwardly and horizontally. The projections 31 and 31 and the projections 31' and 31' are provided on opposite sides with respect to a straight line BB which passes the center C of the opening 34 and which is in parallel to the transferring direction x of the semiconductor wafer 3. The projections 31, 31, 31' and 31' are provided in parallel to a direction y perpendicular to the transferring direction x in a horizontal plane.

The two projections 31 and 31 of the upper wafer mount 30 are held by the upper holding portions 221, the two projections 31' and 31' of the upper wafer mount 30 are held by the upper holding portion 221', the two projections 31 and 31 of the lower wafer mount 30 are held by the lower holding portion 222, and the two projections 31' and 311 of the lower wafer mount 30 are held by the lower holding portion 222'. The two semiconductor wafers 3 which are horizontally held are processed in a state where the wafer mounts 30 are thus held in the reaction tube 2 by the holding member 229.

The semiconductor wafers 3 are inserted into and retrieved from the reaction tube 2 utilizing two transfer jigs (transfer device) 11 in the following manner. The two transfer devices 11 are mounted to a transfer mechanism (not shown), and are vertically moved, horizontally moved and rotated, respectively. In a state where the two transfer devices 11 are superposed one above the other at a predetermined distance therebetween in the vertical direction, each of the transfer devices 11 carrying thereon the wafer mount 30 on which the semiconductor wafer 3 is mounted inserts the semiconductor wafer 3 into the reaction tube 2 and retrieves the semiconductor wafer 3 from the reaction tube 2. When the semiconductor wafer 3 are inserted, the two wafer transfer devices 11 are superposed one above the other in the vertical direction, and the semiconductor wafers 3 which are horizontally mounted on the wafer devices 11 respectively are also superposed one above the other in the vertical direction.

A tip end of each of the transfer devices 11 forks into two transfer jig tip ends (arm) 12 and 12'. The arms 12 and 12' come into and out from the reaction tube 2 in parallel to the transferring direction x of the semiconductor wafer 3. The projections 31 and 31 are put on the arm 12, and the projections 31' and 31' are put on the arm 12', thereby mounting the wafer mount 30 on the transfer device 11. A distance between the arms 12 and 12' of the transfer device 11 is greater than the diameter of the semiconductor wafer 3, and the arms 12 and 12' of the transfer device 11 support the wafer mount 30 outside the semiconductor wafer 3 when the wafer mount 30 on which the semiconductor wafer 3 is mounted is viewed in the vertical direction.

It is preferable that the arms 12 and 12 of the transfer device 11 support the wafer mount 30 outside the semiconductor wafer 3 as viewed in the vertical direction, and it is more preferable that the arms 12 and 12 of the transfer device 11 support the wafer mount 30 on the opposite side (direction of the arrow Y) from the semiconductor wafer 3 with respect to each of two tangent lines 31 and 31 which contacts with the outer periphery of the semiconductor wafer 3 mounted on the wafer mount 30, and which are in parallel to the transferring direction x for inserting into the semiconductor wafer 3 and the wafer mount 30 and/or retrieving the semiconductor wafer 3 and the wafer mount 30 from the reaction tube 2 by the transfer device 11.

In the present embodiment, although the arms 12 and 12 of the transfer device 11 are positioned inside of the two holding portions 220 and 220' of the holding member 229 because of a restricted space in the reaction tube 2, if there is no restriction of the space in the reaction tube 2, it is preferable that the arms 12 and 12 of the transfer device 11 are positioned outside the two holding portions 220 and 220' of the holding member 229.

Next, procedure of process of the semiconductor wafer 3 will be explained. The two semiconductor wafers 3 and 3 are horizontally mounted on the two wafer mounts 30 and 30, respectively, and the two wafer mounts 30 and 30 are held by the transfer devices 11 and 11, respectively. The semiconductor wafers 3 and 3, the wafer mounts 30 and 30, and the transfer devices 11 and 11 in such a state are respectively superposed in the vertical direction one above the other at predetermined distances from one another, and are allowed to stand by outside the reaction tube 2. Then, the gate valve 10a is opened, and the transfer devices 11 and 11 are inserted into the reaction tube 2 in a state where the semiconductor wafers 3 and 3 and the wafer mounts 30 and 30 are respectively superposed in the vertical direction. Thereafter, the transfer devices 11 and 11 are moved downward so that the two projections 31 and 31 of the upper wafer mount 30 are placed on the upper holding portion 221, and two projections 31' and 31' of the upper wafer mount 30 are placed on the upper holding portion 221', the two projections 31 and 31 of the lower wafer mount 30 are placed on the lower holding portion 222, and the two projections 31' and 31' of the lower wafer mount 30 are placed on the lower holding portion 222', thereby holding the two wafer mounts 30 in the reaction tube 2 by the holding member 229.

Then, the transfer devices 11 and 11 are moved out from the reaction tube 2, the gate valve 10a is closed, and processing such as film formation is conducted on the semiconductor wafer 3 while supplying a gas from the gas supply ports 4a and 4b and discharging the gas from the exhaust ports 5b and 5a which are provided on the opposite side from the gas supply ports 4a and 4b (the gas flow in parallel to the wafer 3 as shown with white or black arrow in the drawing) (see FIGS. 3 and 4). A flow of the gas supplied from the gas supply port 4a and discharged from the exhaust port 5b, and a flow of the gas supplied from the gas supply port 4b and discharged from the exhaust port 5a are alternately switched.

After the process of the semiconductor wafer 3 is completed, the inside or interior of the reaction tube 2 is purged into a predetermined atmosphere. Then, the gate valve 10a is opened, the transfer devices 11 and 11 are inserted into the reaction tube 2 in a state that the transfer devices 11 and 11 are vertically superposed at the predetermined distance in the vertical direction. The arms 12 and 12 of the upper transfer device 11 are positioned below the projections 31, 31, 31' and 31' of the upper wafer mount 30, and the arms 12 and 12 of the lower transfer device 11 are positioned below the projections 31, 31, 31' and 31' of the lower wafer mount 30. Then, the transfer devices 11 and 11 are moved upward so that the projections 31, 31, 31' and 31' of the upper wafer mount 30 are put on the arms 12 and 12' of the upper transfer device 11, and the projections 31, 31, 31' and 31' of the lower wafer mount 30 are put on the arms 12 and 12' of the lower transfer device 11. Thereafter, the transfer devices 11 and 11 are retrieved outside from the reaction tube 2 in a state where the semiconductor wafers 3 and 3, and the wafer mounts 30 and 30 are superposed in the vertical direction and then, the gate valve 10a is closed.

While the semiconductor wafers 3 and 3 are inserted into the reaction tube 2, while the semiconductor wafers 3 and 3 are processed, and while the semiconductor wafers 3 and 3 are retrieved from the reaction tube 2, the upper and lower heaters 1 and 1 always heat the inside of the reaction furnace.

The supporting member (wafer mount) 30 is preferably made of quartz, SiC or the like. However, since there is a possibility that quartz may sag under a high temperature, in order to avoid this possibility, it is better to use SiC. However, when SiC is used, since thermal expansion of SiC is great, if the supporting member is deformed, a slippage maybe generated between the wafer mount (supporting member) 30 and the transfer device (transfer jig) 11, and it may be difficult to accurately position the wafer mount in the reaction tube 2 and the wafer mount may be dropped. Therefore, back surfaces 131 of the projections 31 and 31' of the wafer mount 30 are roughly worked so that the back surfaces 131 are not slippery. Further, for the same purpose, a recess 225 is provided on the arm 12 of the transfer device 11, and inclined portions 212 are provided from opposite sides of the recess 225.

With the above explained structure of the present invention, in the hot wall type single wafer or small number of wafers processing thermal treatment apparatus, (1) since the temperature deviation generated within the wafer face can be reduced, it is possible to largely reduce the generation of slip lines due to thermal stress even if the wafer is processed at 900° C. or higher. Therefore, yield of the thermal treatment process of wafer can be enhanced.

Further, (2) since this apparatus processes a small number of wafers (two, three or several wafers) are processed at a time, the apparatus is compatible with other single wafer or small number of wafers processing apparatuses, and a turn around time required for manufacturing semiconductors can be shortened as a whole.

Furthermore, (3) in the present apparatus, since the transfer jig can be retrieved from the reaction furnace during the wafer processing and the reaction furnace can be lidded with a gate valve or the like, there is no possibility that a wafer is exposed to atmosphere between the present apparatus and another processing apparatus, the present invention can be applied to a multi-chamber type cluster unit, and there is an effect to reduce natural oxidization.

A single wafer or small number of wafers processing thermal treatment apparatus is mainly used for oxidization process of a wafer 3, and $O_2$, $H_2O$ or the like is normally used as an oxidization gas. (4) The single wafer or small number of wafers processing thermal treatment apparatus of the present invention can easily be applied to oxidization process using $H_2O$ that is difficult for an apparatus using a lamp as a heating means. This is because that in the case of a lamp anneal apparatus, low temperature regions normally exist in the reaction chamber partially and thus, $H_2O$ vapor condenses. In the case of the hot wall type single wafer or small number of wafers processing thermal treatment apparatus of the present invention, since the temperature within a wafer face can be uniformed and the temperature deviation can be reduced, the oxidization process can be carried out without arising the above problem.

Although the present invention is preferably applied to an oxidization apparatus especially, the invention can preferably be applied also to an epitaxial growth apparatus and a CVD apparatus which process a wafer at 900° C. or higher.

What is claimed is:

1. A semiconductor wafer processing apparatus, comprising:
   a reaction furnace for heating a semiconductor wafer;
   a wafer mount for mounting the semiconductor wafer thereon, said wafer mount including an opening having a diameter which is greater than a diameter of the semiconductor wafer and which has a circular shape or a shape substantially similar to an outer periphery of the semiconductor wafer, and including a wafer supporting portion projecting inwardly of said opening for supporting the semiconductor wafer; and
   a transfer device for transferring said wafer mount carrying the semiconductor wafer thereon substantially horizontally out from said reaction furnace, said transfer device holding said wafer mount outside the semiconductor wafer when said transfer device transfers said wafer mount, as viewed from a vertical direction, at the opposite sides with respect to each of two tangent lines at the outer periphery of the semiconductor wafer mounted on said wafer mount, said two tangent lines being in parallel to a transferring direction for transferring said wafer mount out from said reaction furnace by said transfer device.

2. A semiconductor wafer processing apparatus as recited in claim 1, wherein said transfer device comprises two arms parallel to each other, a distance between said two arms is greater than the diameter of the semiconductor wafer.

3. A semiconductor wafer processing apparatus as recited in claim 2, further comprising:
   a second wafer mount on which a second semiconductor wafer is to be mounted, said second wafer mount including an opening having a diameter which is greater than the diameter of the second semiconductor wafer and which has a circular shape or a shape substantially similar to an outer periphery of the second semiconductor wafer, and including a wafer supporting portion projecting inwardly of said opening for supporting the second semiconductor wafer; and
   a second transfer device for transferring said second wafer mount carrying the second semiconductor wafer thereon substantially horizontally out from said reaction furnace, wherein
   said second transfer device comprises two second arms parallel to each other, a distance between said second two arms is greater than a diameter of the second semiconductor wafer, and said second transfer device holding said second wafer mount outside the second semiconductor wafer as viewed from the vertical direction when said transfer device transfers said wafer mount,
   said first and second wafer mounts are superposed one above the other substantially in the vertical direction at a processing position of the first and second semiconductor wafers to process the first and second semiconductor wafers,
   said first wafer mount on which the first semiconductor wafer is mounted is transferred into said reaction furnace by said first transfer device, said second wafer mount on which the second semiconductor wafer is mounted is transferred into said reaction furnace by said second transfer device, thereby disposing said first and second wafer mounts at said processing position in said reaction furnace where said first and second wafer mounts are superposed one above the other substantially in the vertical direction, or where said first wafer mount on which the first semiconductor wafer is mounted and said second wafer mount on which the second semiconductor wafer is mounted are superposed one above the other substantially in the vertical direction, said first wafer mount on which the first semiconductor wafer is mounted is transferred out from said reaction furnace by said first transfer device, and said second wafer mount on which the second semiconductor wafer is mounted is transferred out from said reaction furnace by said second transfer device.

4. A semiconductor wafer processing apparatus as recited in claim 3, wherein in a state where said first wafer mount on which the first semiconductor wafer is mounted and said second wafer mount on which the second semiconductor wafer is mounted are superposed one above the other substantially in the vertical direction, said first wafer mount is transferred into said reaction furnace by said first transfer device, and said second wafer mount is transferred into said reaction furnace by said second transfer device, to dispose said first and second wafer mounts to be superposed one above the other substantially in the vertical direction at said processing position in said reaction furnace, and/or from a state where said first wafer mount on which the first semiconductor wafer is mounted and said second wafer mount on which the second semiconductor wafer is mounted are superposed one above the other substantially in the vertical direction in said reaction furnace, said first wafer mount on which the first semiconductor wafer is mounted is transferred out from said processing position in said reaction furnace by said first transfer device, and said second wafer mount on which the second semiconductor wafer is mounted is transferred out from said processing position in said reaction furnace by said second transfer device.

5. A semiconductor wafer processing apparatus as recited in claim 3, wherein an outer side of said first wafer mount is substantially circular in shape;
   said first wafer mount comprises a plurality of projections projecting outward from an outer periphery thereof,
   said plurality of first projections are provided at opposite sides with respect to a first straight line which passes the center of said opening of said first wafer mount and which is in parallel to said transferring direction of said first wafer mount by said first transfer device,
   said two first arms of said first transfer device holding said first projections provided at opposite sides outside of the first semiconductor wafer as viewed from the vertical direction when said transfer device transfers said wafer mount,
   an outer side of said second wafer mount is substantially circular in shape;
   said second wafer mount comprises a plurality of projections projecting outward from an outer periphery thereof,
   said second projections are provided at opposite sides with respect to a second straight line which passes the center of said opening and which is in parallel to a transferring direction for transferring said wafer mount out from said reaction furnace by said second transfer device,
   said second transfer device comprises two second arms parallel to each other, a distance between said two second arms is greater than a diameter of the second semiconductor wafer, and
   said two second arms holding said second projections provided at opposite sides outside the second semiconductor wafer as viewed from the vertical direction to hold said second wafer mount when said transfer device transfers said wafer mount.

6. A semiconductor wafer processing apparatus as recited in claim 5, further comprising a holding member including two first holding portions which respectively hold said first projections provided at the opposite sides and which are in parallel to said transferring direction, and two second holding portions which respectively hold said second projections provided at the opposite sides and which are in parallel to said transferring direction, said two first holding portions respectively hold said first projections, and said two second holding portions respectively hold said second projections, thereby superposing said first and second wafer mounts one above the other substantially in the vertical direction at said processing position of the first and second semiconductor wafers in said reaction furnace.

7. A semiconductor wafer processing apparatus as recited in claim 3, wherein said reaction furnace is of a hot wall type, said reaction furnace comprises a reaction tube and heating devices respectively provided above and below said reaction tube.

8. A semiconductor wafer processing apparatus as recited in claim 2, further comprising:

a second wafer mount on which a second semiconductor wafer is to be mounted, said second wafer mount including an opening which is greater than the second semiconductor wafer and which has a circular shape or a shape substantially similar to an outer periphery of the second semiconductor wafer, and including a wafer supporting portion projecting inwardly of said opening for supporting the second semiconductor wafer; and a second transfer device for transferring said second wafer mount carrying the second semiconductor wafer thereon substantially horizontally, out from said reaction furnace, said second transfer device holding said second wafer mount outside the semiconductor wafer as viewed from a vertical direction when said transfer device transfers said wafer mount, wherein said first and second wafer mounts are superposed one above the other substantially in the vertical direction at a processing position of the first and second semiconductor wafers to process the first and second semiconductor wafers, said first wafer mount on which the first semiconductor wafer is mounted is transferred into said reaction furnace by said first transfer device, said second wafer mount on which the second semiconductor wafer is mounted is transferred into said reaction furnace by said second transfer device, thereby disposing said first and second wafer mounts at said processing position in said reaction furnace where said first and second wafer mounts are superposed one above the other substantially in the vertical direction, or where said first wafer mount on which the first semiconductor wafer is mounted and said second wafer mount on which the second semiconductor wafer is mounted are superposed one above the other substantially in the vertical direction, said first wafer mount on which the first semiconductor wafer is mounted is transferred out from said reaction furnace by said first transfer device, and said second wafer mount on which the second semiconductor wafer is mounted is transferred out from said reaction furnace by said second transfer device.

9. A semiconductor wafer processing apparatus as recited in claim 8, wherein where said first wafer mount on which the first semiconductor wafer is mounted and said second wafer mount on which the second semiconductor wafer is mounted are superposed one above the other substantially in the vertical direction, said first wafer mount is transferred into said reaction furnace by said first transfer device, and said second wafer mount is transferred into said reaction furnace by said second transfer device, to superpose said first and second wafer mounts one above the other substantially in the vertical direction in said processing position in said reaction furnace, or where said first wafer mount on which the first semiconductor wafer is mounted and said second wafer mount on which the second semiconductor wafer is mounted are superposed one above the other substantially in the vertical direction in said reaction furnace, said first wafer mount on which the first semiconductor wafer is mounted is transferred out from said processing position in said reaction furnace by said first transfer device, and said second wafer mount on which the second semiconductor wafer is mounted is transferred out from said processing position in said reaction furnace by said second transfer device.

10. A semiconductor wafer processing apparatus as recited in claim 8, wherein said reaction furnace is of a hot wall type, said reaction furnace comprises a reaction tube and heating devices respectively provided above and below said reaction tube.

11. A semiconductor wafer processing apparatus as recited in claim 2, further comprising:

a second wafer mount for mounting a second semiconductor wafer thereon, said second wafer mount including an opening which is greater than the second semiconductor wafer and which has a circular shape or a shape substantially similar to an outer periphery of the second semiconductor wafer, and including a wafer supporting portion projecting inwardly of said opening for supporting the second semiconductor wafer, said second wafer mount being formed integrally with said first wafer mount where said first and second wafer mounts are superposed one above the other substantially in the vertical direction, where the first semiconductor wafer is substantially horizontally mounted on said first wafer mount and the second semiconductor wafer is substantially horizontally mounted on said second wafer mount, said transfer device holding said integrally formed first and second wafer mounts outside the first and second semiconductor wafers as viewed from the vertical direction when said transfer device transfers said wafer mount, and transferring said integrally formed first and second wafer mounts out from said reaction furnace.

12. A semiconductor wafer processing apparatus as recited in claim 1, wherein the outer side of said wafer mount is substantially circular in shape.

13. A semiconductor wafer processing apparatus as recited in claim 12, wherein said wafer mount comprises projections projecting outward from an outer periphery thereof, and said transfer device transfers said wafer mount by holding said projections.

14. A semiconductor wafer processing apparatus as recited in claim 12, wherein said wafer mount comprises a plurality of projections projecting outward from an outer periphery thereof;

said projections are provided on opposite sides with respect to a straight line which passes the center of said opening and which is in parallel to a transferring direction for transferring said wafer mount out from said reaction furnace by said transfer device, and said transfer device transfers said wafer mount by holding said plurality of projections.

15. A semiconductor wafer processing apparatus as recited in claim 14, wherein said transfer device comprises two arms parallel to each other, a distance between said two arms is greater than the diameter of the semiconductor wafer, said two arms hold said wafer mount by holding said plurality of projections provided on the opposite sides outside the semiconductor wafer as viewed from the vertical direction.

16. A semiconductor wafer processing apparatus as recited in claim 15, further comprising a holding member including two holding portions which respectively hold said plurality of projections provided on opposite sides and which are disposed in parallel to said transferring direction, said holding member places the semiconductor wafer at a processing position of the semiconductor wafer in said reaction furnace by holding said wafer mount on which the semiconductor wafer is mounted.

17. A semiconductor wafer processing apparatus as recited in claim 1, wherein said reaction furnace is of a hot wall type.

18. A method for manufacturing a semiconductor device comprising the steps of:
  mounting a semiconductor wafer on a wafer mount, said wafer mount including an opening which is greater than the semiconductor wafer and which has a circular shape or a shape substantially similar to an outer periphery of the semiconductor wafer, and including a wafer supporting portion projecting inwardly of said opening for supporting the semiconductor wafer;
  transferring said wafer mount by a transfer device for transferring said wafer mount carrying the semiconductor wafer thereon out from a reaction furnace, said transfer device holding said wafer mount outside the semiconductor wafer, as viewed from a vertical direction, at the opposite sides with respect to each of two tangent lines at the outer periphery of the semiconductor wafer mounted on said wafer mount, said two tangent lines being in parallel to a transferring direction for transferring said wafer mount out from said reaction furnace by said transfer device:
  processing the semiconductor wafer while heating the semiconductor wafer in said reaction furnace; and
  forming the semiconductor device on the semiconductor wafer.

19. A method for manufacturing a semiconductor device as recited in claim 18, wherein
  said reaction furnace is of a hot wall type,
  said step of transferring said wafer mount out from said reaction furnace by said transfer device is a step of transferring said wafer mount on which the semiconductor wafer is mounted out from said reaction furnace by said transfer device where an inside of said reaction furnace is heated.

20. A semiconductor wafer processing apparatus, comprising:
  a reaction furnace of a hot wall type;
  a wafer mount for mounting a semiconductor wafer thereon, said wafer mount including an opening having a diameter which is greater than a diameter of the semiconductor wafer and which has a circular shape or a shape substantially similar to an outer periphery of the semiconductor wafer, and including a wafer supporting portion projecting inwardly of said opening for supporting the semiconductor wafer; and
  a transfer device for transferring said wafer mount carrying the semiconductor wafer thereon substantially horizontally out from said reaction furnace, said transfer device holding said wafer mount outside the semiconductor wafer as viewed from a vertical direction when said transfer device transfers said wafer mount.

21. A semiconductor wafer processing apparatus, comprising:
  a reaction furnace for heating a semiconductor wafer;
  a wafer mount for mounting the semiconductor wafer thereon, said wafer mount including an opening having a diameter which is greater than a diameter of the semiconductor wafer and which has a circular shape or a shape substantially similar to an outer periphery of the semiconductor wafer, and including a wafer supporting portion projecting inwardly of said opening for supporting the semiconductor wafer; and
  a transfer device for transferring said wafer mount carrying the semiconductor wafer thereon substantially horizontally into said reaction furnace, said transfer device holding said wafer mount outside the semiconductor wafer when said transfer device transfers said wafer mount, as viewed from a vertical direction, at the opposite sides with respect to each of two tangent lines at the outer periphery of the semiconductor wafer mounted on said wafer mount, said two tangent lines being in parallel to a transferring direction for transferring said wafer mount into said reaction furnace by said transfer device.

22. A method for manufacturing a semiconductor device comprising the steps of:
  mounting a semiconductor wafer on a wafer mount, said wafer mount including an opening which is greater than the semiconductor wafer and which has a circular shape or a shape substantially similar to an outer periphery of the semiconductor wafer, and including a wafer supporting portion projecting inwardly of said opening for supporting the semiconductor wafer;
  transferring said wafer mount by a transfer device for transferring said wafer mount carrying the semiconductor wafer thereon into a reaction furnace, said transfer device holding said wafer mount outside the semiconductor wafer, as viewed from a vertical direction, at the opposite sides with respect to each of two tangent lines at the outer periphery of the semiconductor wafer mounted on said wafer mount, said two tangent lines being in parallel to a transferring direction for transferring said wafer mount into said reaction furnace by said transfer device:
  processing the semiconductor wafer while heating the semiconductor wafer in said reaction furnace; and
  forming the semiconductor device on the semiconductor wafer.

23. A method for manufacturing a semiconductor device as recited in claim 22, wherein
  said reaction furnace is of a hot wall type,
  said step of transferring said wafer mount into said reaction furnace by said transfer device is a step of transferring said wafer mount on which the semiconductor wafer is mounted into said reaction furnace by said transfer device where an inside of said reaction furnace is heated.

24. A semiconductor wafer processing apparatus, comprising:

a reaction furnace of a hot wall type;

a wafer mount for mounting a semiconductor wafer thereon, said wafer mount including an opening having a diameter which is greater than a diameter of the semiconductor wafer and which has a circular shape or a shape substantially similar to an outer periphery of the semiconductor wafer, and including a wafer supporting portion projecting inwardly of said opening for supporting the semiconductor wafer; and a transfer device for transferring said wafer mount carrying the semiconductor wafer thereon substantially horizontally into said reaction furnace, said transfer device holding said wafer mount outside the semiconductor wafer as viewed from a vertical direction when said transfer device transfers said wafer mount.

25. A semiconductor wafer processing apparatus, comprising:

a reaction furnace for heating a semiconductor wafer;

a wafer mount for mounting the semiconductor wafer thereon, said wafer mount including an opening having a diameter which is greater than a diameter of the semiconductor wafer and which has a circular shape or a shape substantially similar to an outer periphery of the semiconductor wafer, and including a wafer supporting portion projecting inwardly of said opening for supporting the semiconductor wafer; and a transfer device for transferring said wafer mount carrying the semiconductor wafer thereon substantially horizontally into and out from said reaction furnace, said transfer device holding said wafer mount outside the semiconductor wafer when said transfer device transfers said wafer mount, as viewed from a vertical direction, at the opposite sides with respect to each of two tangent lines at the outer periphery of the semiconductor wafer mounted on said wafer mount, said two tangent lines being in parallel to a transferring direction for transferring said wafer mount into and out from said reaction furnace by said transfer device.

26. A method for manufacturing a semiconductor device comprising the steps of:

mounting a semiconductor wafer on a wafer mount, said wafer mount including an opening which is greater than the semiconductor wafer and which has a circular shape or a shape substantially similar to an outer periphery of the semiconductor wafer, and including a wafer supporting portion projecting inwardly of said opening for supporting the semiconductor wafer;

transferring said wafer mount by a transfer device for transferring said wafer mount carrying the semiconductor wafer thereon into and out from a reaction furnace, said transfer device holding said wafer mount outside the semiconductor wafer, as viewed from a vertical direction, at the opposite sides with respect to each of two tangent lines at the outer periphery of the semiconductor wafer mounted on said wafer mount, said two tangent lines being in parallel to a transferring direction for transferring said wafer mount into and out from said reaction furnace by said transfer device:

processing the semiconductor wafer while heating the semiconductor wafer in said reaction furnace; and forming the semiconductor device on the semiconductor wafer.

27. A method for manufacturing a semiconductor device as recited in claim 26, wherein said reaction furnace is of a hot wall type, said step of transferring said wafer mount into and out from said reaction furnace by said transfer device is a step of transferring said wafer mount on which the semiconductor wafer is mounted into and out from said reaction furnace by said transfer device where an inside of said reaction furnace is heated.

28. A semiconductor wafer processing apparatus, comprising:

a reaction furnace of a hot wall type;

a wafer mount for mounting a semiconductor wafer thereon, said wafer mount including an opening having a diameter which is greater than a diameter of the semiconductor wafer and which has a circular shape or a shape substantially similar to an outer periphery of the semiconductor wafer, and including a wafer supporting portion projecting inwardly of said opening for supporting the semiconductor wafer; and a transfer device for transferring said wafer mount carrying the semiconductor wafer thereon substantially horizontally into and out from said reaction furnace, said transfer device holding said wafer mount outside the semiconductor wafer as viewed from a vertical direction when said transfer device transfers said wafer mount.

* * * * *